US010541259B2

(12) United States Patent
Nakamura et al.

(10) Patent No.: US 10,541,259 B2
(45) Date of Patent: Jan. 21, 2020

(54) SOLID-STATE IMAGING DEVICE, IMAGING DEVICE, AND ELECTRONIC APPARATUS

(71) Applicant: Sony Semiconductor Solutions Corporation, Kanagawa (JP)

(72) Inventors: Shigeki Nakamura, Kanagawa (JP); Seichi Otsuki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/771,792

(22) PCT Filed: Sep. 20, 2016

(86) PCT No.: PCT/JP2016/077665
§ 371 (c)(1),
(2) Date: Apr. 27, 2018

(87) PCT Pub. No.: WO2017/077775
PCT Pub. Date: May 11, 2017

(65) Prior Publication Data
US 2018/0323225 A1 Nov. 8, 2018

(30) Foreign Application Priority Data
Nov. 5, 2015 (JP) .................. 2015-217243

(51) Int. Cl.
*H01L 27/146* (2006.01)
*H04N 5/235* (2006.01)
(Continued)

(52) U.S. Cl.
CPC ......... *H01L 27/146* (2013.01); *H04N 5/2353* (2013.01); *H04N 5/353* (2013.01); *H04N 5/35536* (2013.01); *G03B 7/093* (2013.01)

(58) Field of Classification Search
CPC .. H01L 27/146; H04N 5/378; H04N 5/35581; H04N 5/3532; H04N 5/35554; H04N 5/2353; H04N 5/35536
See application file for complete search history.

(56) References Cited

U.S. PATENT DOCUMENTS

2007/0097242 A1* 5/2007 Oshima ................ H04N 3/1575
348/312
2013/0208147 A1* 8/2013 Koshiba ................ G03B 7/093
348/239

FOREIGN PATENT DOCUMENTS

JP 2002-118789 A 4/2002
JP 2011-244309 A 12/2011
(Continued)

OTHER PUBLICATIONS

International Search Report and English translation thereof dated Nov. 22, 2016 in connection with International Application No. PCT/JP2016/077665.

(Continued)

*Primary Examiner* — Ahmed A Berhan
(74) *Attorney, Agent, or Firm* — Wolf, Greenfield & Sacks, P.C.

(57) ABSTRACT

A solid-state imaging device according to the present disclosure includes a pixel array unit in which unit pixels including photoelectric conversion elements are arranged in a matrix form and the unit pixels are grouped into a plurality of pixel groups and a timing controller which independently sets an exposure start timing and an exposure end timing relative to each of the plurality of pixel groups so that at least one pixel group of the plurality of pixel groups is exposed a plurality of times within a single vertical synchronization period.

19 Claims, 25 Drawing Sheets

(51) Int. Cl.
H04N 5/355 (2011.01)
H04N 5/353 (2011.01)
G03B 7/093 (2006.01)
H04N 5/232 (2006.01)
H04N 5/378 (2011.01)

(56) References Cited

FOREIGN PATENT DOCUMENTS

| | | |
|---|---|---|
| JP | 2014-154982 A | 8/2014 |
| WO | WO 2006/049098 A1 | 11/2006 |
| WO | WO 2012/042967 A1 | 4/2012 |

OTHER PUBLICATIONS

Written Opinion and English translation thereof dated Nov. 22, 2016 in connection with International Application No. PCT/JP2016/077665.

International Preliminary Report on Patentability and English translation thereof dated May 17, 2018 in connection with International Application No. PCT/JP2016/077665.

* cited by examiner

SOLID-STATE IMAGING DEVICE, IMAGING DEVICE, AND ELECTRONIC APPARATUS

CROSS-REFERENCE TO RELATED APPLICATIONS

This application claims the benefit under 35 U.S.C. § 371 as a U.S. National Stage Entry of International Application No. PCT/JP2016/077665, filed in the Japanese Patent Office as a Receiving Office on Sep. 20, 2016, which claims priority to Japanese Patent Application Number JP 2015-217243, filed in the Japanese Patent Office on Nov. 5, 2015, each of which is hereby incorporated by reference in its entirety.

TECHNICAL FIELD

The present disclosure relates to a solid-state imaging device, an imaging device, and an electronic apparatus.

BACKGROUND ART

As a solid-state imaging device, for example, a charge coupled device (CCD) image sensor (CCD type solid-state imaging device) and a complementary metal oxide semiconductor (CMOS) image sensor (CMOS type solid-state imaging device) have been known. The solid-state imaging device accumulates electric charges according to an amount of incident light and performs photoelectric conversion for outputting an electric signal corresponding to the accumulated electric charges. However, since there is an upper limit level in an electric charge accumulating amount, if light of which an amount is equal to or more than the upper limit level is received in a certain exposure time, the accumulated electric charge amount reaches a saturation level. As a result, a tone equal to or higher than the saturation level cannot be expressed, and so-called halation occurs.

The halation can be avoided by releasing a shutter in a short time so that the accumulated electric charge mount is not saturated. However, in a case where a scene with a high dynamic range (HDR) in which a bright region and a dark region are mixed is imaged, the electric charges cannot be sufficiently accumulated regarding the dark region. Therefore, the dark region is in a so-called blackened state in which a SN ratio (S/N) is poor and an image quality is deteriorated.

As a technology of imaging a scene with a high dynamic range, a method of serially imaging a plurality of images with different exposure times and synthesizing the images to extend the dynamic range has been known. However, in this method, since the plurality of images imaged at imaging timings separated from each other is synthesized, there has been a problem in that multiple image is easily created if a subject moves between the imaging timings or in that a frame rate at which a synthesized image is obtained is lowered as the number of imaging images is increased.

Whereas, there is a technology for obtaining the plurality of images under a plurality of times of exposures for one imaging by imaging images as performing control so that exposure times are respectively different for pixels, instead of serially imaging the plurality of images, and synthesizing the plurality of images to generate an image with a high dynamic range (for example, Patent Documents 1 and 2). According to this technology, the scene with a high dynamic range can be imaged without saturation (no halation) and without causing blackening.

CITATION LIST

Patent Document

Patent Document 1: Japanese Patent Application Laid-Open No. 2002-118789
Patent Document 2: International Publication No. 2006/049098

SUMMARY OF THE INVENTION

Problems to be Solved by the Invention

However, in the related art described in Patent Documents 1 and 2, the number of exposures to be realized is determined by the number of divisions of a spatial resolution. Therefore, there has been a problem in that the spatial resolution easily deteriorates in a case where the scene with a high dynamic range is imaged by the plurality of times of exposures.

Accordingly, an object of the present disclosure is to provide a solid-state imaging device capable of imaging a scene with a high dynamic range without deteriorating a spatial resolution, an imaging device including the solid-state imaging device, and an electronic apparatus including the imaging device.

Solutions to Problems

A solid-state imaging device according to the present disclosure to achieve the above object includes a pixel array unit in which unit pixels including photoelectric conversion elements are arranged in a matrix form and each unit pixel is grouped into a plurality of pixel groups and a timing controller which independently sets an exposure start timing and an exposure end timing relative to each of the plurality of pixel groups so that at least one pixel group of the plurality of pixel groups is exposed a plurality of times within a single vertical synchronization period.

An imaging device according to the present disclosure to achieve the above object is an imaging device including the solid-state imaging device having the above configuration. Furthermore, an electronic apparatus according to the present disclosure to achieve the above object is an electronic apparatus including the solid-state imaging device having the above configuration. In the solid-state imaging device, the imaging device, or the electronic apparatus having the above-described configuration, by performing exposure a plurality of times within a single vertical synchronization period, when imaging a scene with a high dynamic range, exposure time ratios between the plurality of exposure images by the plurality of times of exposures can be set close to each other.

Effects of the Invention

According to the present disclosure, since the exposure time ratio between the exposure images can be set close to each other by performing the exposure a plurality of times within one vertical synchronization period, it is possible to capture a scene with a high dynamic range without lowering the spatial resolution.

Furthermore, the effects are not limited to the above, and the effect may be any effects described herein. Furthermore, the effects described herein are only exemplary, and the effect of the present disclosure is not limited to these. Also, there may be an additional effect.

MODE FOR CARRYING OUT THE INVENTION

Figure 1:
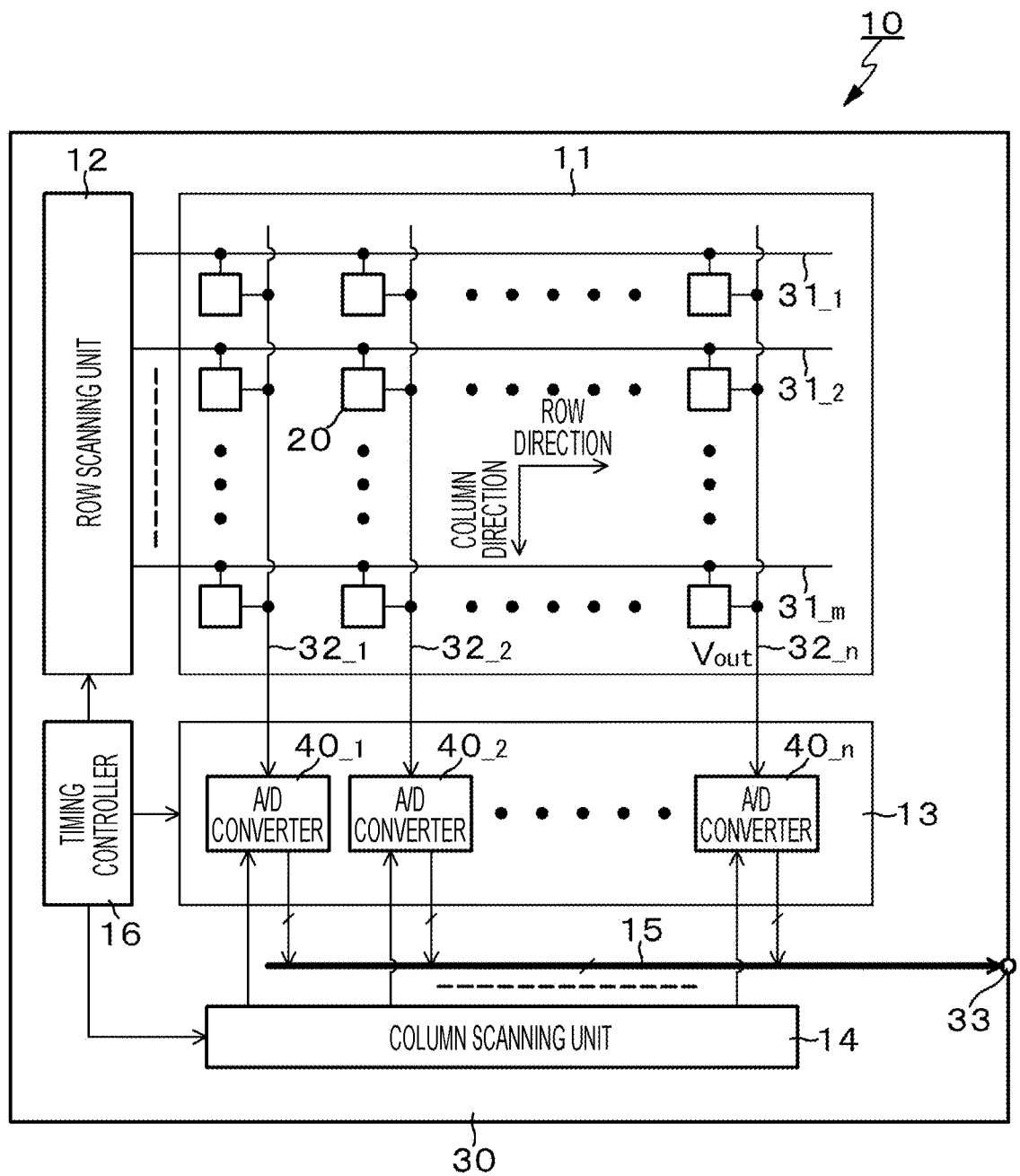
FIG. 1 is a system configuration diagram of a schematic configuration of a CMOS image sensor which is an exemplary solid-state imaging device according to the present disclosure.

Embodiments of the present disclosure are described in detail below with reference to the drawings. A technology of the present disclosure is not limited to the embodiments, and various values and the like in the embodiments are only exemplary. In the following description, the same elements or elements having the same functions are denoted with the same reference numerals, and overlapped description is omitted. Note that the description will be made in the following order.

1. General Description on Solid-State Imaging Device, Imaging Device, and Electronic Apparatus according to the Present Disclosure
2. Solid-State Imaging Device according to the Present Disclosure (Example of CMOS Image Sensor)
   2-1. System Configuration
   2-2. Circuit Configuration of Unit Pixel
   2-3. Grouping of Unit Pixels
   2-4.1. Multiple Exposures Within Vertical Synchronization Period
   2-5. Example of Exposure Sequence
   2-6. Example of Arranging a Plurality of A/D Converters for Single Pixel Column
   2-7. Modification
3. Imaging Device according to the Present Disclosure
   3-1. System Configuration
   3-2. Configuration of Image Processor
   3-2-1. First Embodiment (Example of Synchronization Processing)
   3-2-2. Second Embodiment (Example of Sequential HDR Synthesis for Each Pixel Group)
   3-2-3. Third Embodiment (Example of Sequential HDR Synthesis between Pixel Groups)
   3-2-4. Fourth Embodiment (Example of Measures against Blackout due to Flicker Phenomenon)
4. Electronic Apparatus according to the Present Disclosure <General Description on Solid-State Imaging Device, Imaging Device, and Electronic Apparatus according to the Present Disclosure>

In a solid-state imaging device, an imaging device, and an electronic apparatus according to the present disclosure, a timing controller can have a configuration of independently setting an exposure start timing and an exposure end timing relative to each of a plurality of pixel groups so that an exposure end timing of a unit pixel in a row which is read first of an exposure image to which exposure has been started later is earlier than an exposure end timing of a unit pixel of a row which is a final read row of an exposure image to which the exposure has been previously started regarding at least two times of exposures of a plurality of times of exposures.

In the solid-state imaging device, the imaging device, and the electronic apparatus according to the present disclosure including the above-described preferred configuration, the timing controller can have a configuration of performing control to output respective pieces of image data in a time division manner for each row regarding the plurality of exposure images of which exposure ends are temporally overlapped. Furthermore, an image processor can be included which generates an image with a high dynamic range on the basis of the image data of each exposure image of the plurality of pixel groups.

In addition, in the solid-state imaging device, the imaging device, and the electronic apparatus according to the present disclosure including the above-described preferred configuration, the image processor can have a configuration in which pixel value data for each row of an exposure image of which an exposure order is not last within a single vertical synchronization period is held in a storage unit. Furthermore, a row sequence conversion unit can be included which reads pixel value data of the same row from the storage unit and outputs the data as aligning the rows of the plurality of exposure images according to an output timing of the pixel value data for each row of the exposure image which is exposed last within the single vertical synchronization period. Furthermore, the image processor can have a configuration including a first image synthesis unit which synthesizes the pixel value data of the plurality of exposure pixels output from the row sequence conversion unit as aligning the rows between the plurality of exposure pixels and outputs the data.

Alternatively, in the solid-state imaging device, the imaging device, and the electronic apparatus according to the present disclosure including the above-described preferred configuration, the image processor can have a configuration in which pixel value data of an exposure image which is exposed first within a single vertical synchronization period is held in a storage unit. In addition, regarding the exposure image of which the exposure order is other than the first within the single vertical synchronization period, a configuration can be used which calculates a synthesis pixel value with reference to pixel value data corresponding to a pixel position and a peripheral pixel position of the exposure image which has been already held in the storage unit for each pixel and holds the synthesis pixel value in the storage unit. Furthermore, a second image synthesis unit can be included which outputs the final synthesis result when the synthesis of the pixel value data regarding the exposure image which is exposed last within the single vertical synchronization period has been completed.

In addition, in the solid-state imaging device, the imaging device, and the electronic apparatus according to the present disclosure including the above-described preferred configuration, the second image synthesis unit can have a configuration in which the pixel value data of the exposure image which is exposed first within the single vertical synchronization period is held in the storage unit for each pixel group. In addition, regarding the exposure image of which the exposure order is other than the first within the single vertical synchronization period, a configuration can be used which calculates a synthesis pixel value with reference to pixel value data corresponding to a pixel position and a peripheral pixel position of the exposure image which has been already held in the storage unit for each pixel and holds the synthesis pixel value in the storage unit. Furthermore, the image processor can have a configuration including an inter-group synthesis unit which calculates a synthesis value between the pixel groups with reference to the final synthesis result of each pixel group obtained by synthesizing the exposure image which is exposed last within the single vertical synchronization period by the second image synthesis unit.

Alternatively, in the solid-state imaging device, the imaging device, and the electronic apparatus according to the present disclosure including the above-described preferred configuration, the image processor can have a configuration in which pixel value data of an exposure image which is exposed first within the single vertical synchronization period is held in the storage unit of the exposure images in all the pixel groups. In addition, regarding the exposure image of which the exposure order is other than the first within the single vertical synchronization period, a configuration can be used which calculates a synthesis pixel value with reference to pixel value data corresponding to a pixel position and a peripheral pixel position of the exposure image which has been already held in the storage unit for each pixel and holds the synthesis pixel value in the storage unit. Furthermore, a third image synthesis unit can be included which outputs the final synthesis result when the synthesis of the pixel value data regarding the exposure image which is exposed last within the single vertical synchronization period has been completed.

Furthermore, in the solid-state imaging device, the imaging device, and the electronic apparatus according to the present disclosure including the above-described preferred configuration, the image processor can have a configuration including a pixel value interpolation unit which interpolates pixel values to all the pixel positions on the basis of the pixel values read for the respective pixel groups. At this time, the third image synthesis unit can have a configuration in which the pixel value data of the exposure image which is exposed first within the single vertical synchronization period from among all the exposure images in all the pixel groups is held in the storage unit on the basis of an output of the pixel value interpolation unit. In addition, regarding the exposure image of which the exposure order is other than the first within the single vertical synchronization period, a configuration can be used which calculates a synthesis pixel value with reference to pixel value data corresponding to a pixel position and a peripheral pixel position of the exposure image which has been already held in the storage unit for each pixel and holds the synthesis pixel value in the storage unit.

Furthermore, in the solid-state imaging device, the imaging device, and the electronic apparatus according to the present disclosure including the above-described preferred configuration, the image processor can have a configuration including a moving subject determination unit which determines whether a subject moves at each pixel position and a synthesis ratio determination unit which determines a synthesis ratio at the time of calculating a synthesis pixel value on the basis of the determination result of the moving subject determination unit. At the time, the moving subject determination unit can have a configuration of estimating whether the subject moves at each pixel position with reference to the pixel value of the exposure image and the pixel value in the storage unit.

Furthermore, in the solid-state imaging device, the imaging device, and the electronic apparatus according to the present disclosure including the above-described preferred configuration, the image processor can have a configuration including a synthesis ratio history storage unit which stores a history of the synthesis ratio determined by the synthesis ratio determination unit. At this time, the synthesis ratio determination unit can have a configuration of determining the synthesis ratio with reference to the history of the synthesis ratio stored in the synthesis ratio history storage unit. Furthermore, the synthesis ratio determination unit can have a configuration of determining the synthesis ratio with reference to an exposure time of each exposure image, and in addition, determining the synthesis ratio with reference to a pixel value level of each exposure image.

Furthermore, in the solid-state imaging device, the imaging device, and the electronic apparatus according to the present disclosure including the above-described preferred configuration, an A/D converter can be included which digitizes an analog pixel signal output from each unit pixel of the pixel array unit for each pixel column.

Furthermore, in the imaging device according to the present disclosure including the above-described preferred configuration, the timing controller can have a configuration which sets each exposure start time and each exposure time length of a plurality of exposure images imaged by the plurality of times of exposures in consideration of a blinking period of a light emitting object, in a case of capturing the light emitting object.

<Solid-State Imaging Device According to the Present Disclosure>

First, a schematic configuration of a solid-state imaging device according to the present disclosure will be described. Here, a CMOS image sensor will be described as an example of the solid-state imaging device according to the present disclosure.

[System Configuration]

FIG. 1 is a system configuration diagram of a schematic configuration of the CMOS image sensor according to the present disclosure. As illustrated in FIG. 1, a CMOS image sensor 10 has a pixel array unit 11, a drive system and a signal processing system in the vicinity thereof. In the present example, for example, a row scanning unit 12, a column processing unit 13, a column scanning unit 14, a horizontal output line 15, and a timing controller 16 are provided as the drive system and the signal processing system in the vicinity. The drive system and the signal processing system are integrated on a same semiconductor substrate (chip) 30 where the pixel array unit 11 is integrated.

In the system configuration described above, the timing controller 16 generates a clock signal, a control signal, and the like to be a reference of operations of the row scanning unit 12, the column processing unit 13, the column scanning unit 14, and the like, for example, on the basis of a vertical synchronization signal VD, a horizontal synchronization signal HD, a master clock MCK, and the like input from outside. The clock signal, the control signal, and the like generated by the timing controller 16 are applied to the row scanning unit 12, the column processing unit 13, the column scanning unit 14, and the like as driving signals of these units.

The pixel array unit 11 has a configuration in which unit pixels 20 (which may be simply referred to as "pixel" below) including photoelectric conversion elements which generate and accumulate a photoelectric charge according to an amount of received light are arranged along a row direction and a column direction, that is, two dimensionally arranged in a matrix (matrix form). Here, the row direction indicates an arrangement direction of the pixels in a pixel row, and the column direction indicates an arrangement direction of the pixels in a pixel column.

In the pixel array unit 11, in the pixel arrangement including m rows and n columns, a row control lines 31 ($31_1$ to $31_m$) are arranged for each pixel row along the row direction, and column signal lines 32 ($32_1$ to $32_n$) are arranged for each pixel column along the column direction. The row control line 31 transmits a control signal used to perform control when a signal is read from the unit pixel 20. The row control line 31 is illustrated as a single wiring in FIG. 1. However, the number of row control lines 31 is not limited to one. The respective ends of the row control lines $31_1$ to $31_m$ are connected to respective output ends of the row scanning unit 12 corresponding to the respective rows.

The row scanning unit 12 includes a shift register, an address decoder, and the like and drives the pixels 20 of the pixel array unit 11 all at the same time, row by row, or the like. A specific configuration of the row scanning unit 12 is not illustrated. However, the row scanning unit 12 generally includes two scanning systems, i.e., a read scanning system and a sweeping scanning system. The read scanning system selects and scans the unit pixels 20 of the pixel array unit 11 row by row to read a signal from the unit pixel 20. The signal read from the unit pixel 20 is an analog signal. The sweeping scanning system sweeps and scans the pixels prior to the read scanning by a time of shutter speed relative to a read row to which the read scanning is performed by the read scanning system.

By performing the sweep scanning by the sweeping scanning system, unnecessary electric charges are swept out from the photoelectric conversion element of the unit pixel 20 in the read row. Accordingly, the photoelectric conversion element is reset. Then, by sweeping out (reset) the unnecessary electric charges by the sweeping scanning system, a so-called electronic shutter operation is performed. Here, the electronic shutter operation is an operation for throwing out the photoelectric charge of the photoelectric conversion element and for newly starting exposure (start to accumulate photoelectric charges).

A signal read by the read operation by the read scanning system corresponds to an amount of light received after the read operation performed immediately before that or after the electronic shutter operation. Then, a period from a signal read timing by the read operation performed immediately before or a sweep-out timing by the electronic shutter operation to a signal read timing by the read operation at this time is an exposure period of the photoelectric charge in the unit pixel 20. In this exposure period, the signal read timing by the read operation performed immediately before or the sweep-out timing by the electronic shutter operation is an exposure start timing, and the signal read timing by the read operation at this time is an exposure end timing.

The column processing unit 13 is, for example, a signal processing unit including analog/digital (A/D) converters 40 ($40_1$ to $40_n$), and each A/D converter 40 is provided for each pixel column of the pixel array unit 11, that is, for each column signal line 32 ($32_1$ to $32_n$) in a one-to-one correspondence relation. Each of the A/D converters 40 ($40_1$ to $40_n$) digitizes an analog pixel signal output from each unit pixel 20 of the pixel array unit 11 for each pixel column.

The A/D converter 40 can include, for example, a comparator and a counter. The comparator uses a reference signal of which a voltage value changes in a stepwise manner as time elapses, that is, a so-called slope-shaped waveform as a reference input and uses the analog pixel signal output from each unit pixel 20 of the pixel array unit 11 for each pixel column as a comparison input and compares the reference input and the comparison input with each other. The counter converts the analog pixel signal into digital data by performing a counting operation over a period from start of the comparison operation to the end of the comparison operation by the comparator in synchronization with a predetermined clock.

Here, by using an up-down counter as the counter in the A/D converter 40 having the above configuration, processing of removing noise at the time of a reset operation of the unit pixel 20, specifically, noise removal processing by Correlated Double Sampling (CDS) can be executed. From the unit pixel 20, for example, a reset component and a signal component are sequentially read in a time series manner. The reset component corresponds to the pixel signal when the unit pixel 20 is reset. The signal component corresponds to the pixel signal obtained by photoelectric conversion by the unit pixel 20.

Figure 2:
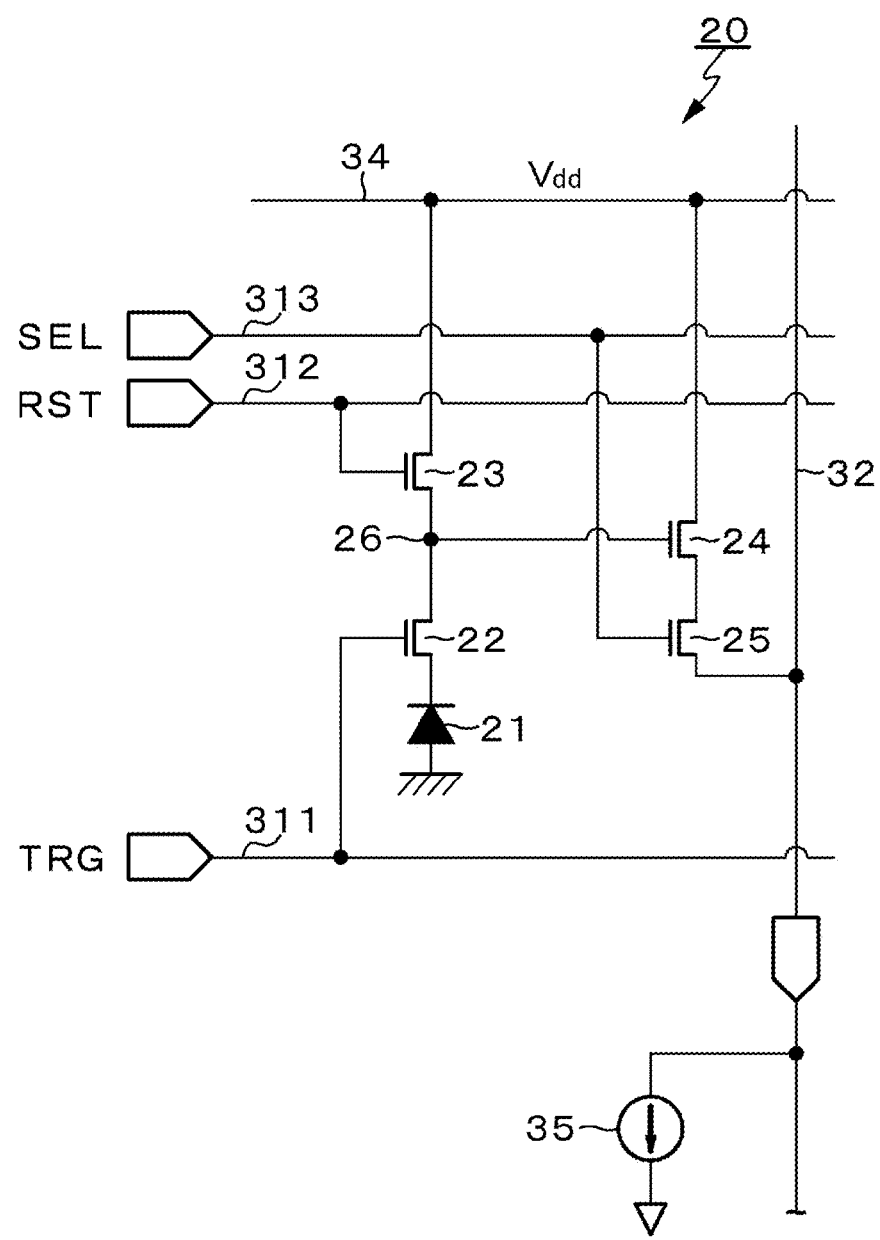
FIG. 2 is a circuit diagram of an exemplary circuit configuration of a unit pixel.

In the method of reading the reset component first, random noise generated at the time of the reset is held by an electric charge detection unit 26 (refer to FIG. 2). Therefore, in the signal component read by adding a signal electric charge, noise of which the amount is as much as that in the reset component is held. Therefore, the up-down counter can execute the CDS processing of subtracting the reset component from the signal component, for example, by counting down the reset component and counting up the signal component.

The column scanning unit 14 includes a shift register, an address decoder, and the like and controls column addresses and column scanning of the A/D converters $40_1$ to $40_n$ in the column processing unit 13. Digital data A/D converted by each of the A/D converters $40_1$ to $40_n$ under the control by the column scanning unit 14 is sequentially read to the horizontal output line 15, and then, is output from an output terminal 33 to the outside of the chip (semiconductor substrate) 30 as imaging data.

[Circuit Configuration of Unit Pixel]

FIG. 2 is a circuit diagram of an exemplary circuit configuration of the unit pixel 20. As illustrated in FIG. 2, the unit pixel 20 according to the present example includes, for example, a photodiode (PD) 21 as a photoelectric conversion element. In addition to the photodiode 21, for example, the unit pixel 20 includes a transfer transistor 22, a reset transistor 23, an amplifier transistor 24, and a selection transistor 25.

Here, for example, N-type MOSFETs are used as four transistors, i.e., the transfer transistor 22, the reset transistor 23, the amplifier transistor 24, and the selection transistor 25. However, a combination of conductivity types of the four transistors 22 to 25 exemplified here is merely an example, and the combination thereof is not limited to this.

A plurality of control lines 311 to 313 are arranged relative to each unit pixel 20 in the same pixel row in common as the row control lines 31 ($31_1$ to $31_m$) described above. The plurality of control lines 311 to 313 is connected to an output end corresponding to each pixel row of the row scanning unit 12 in pixel row unit. The row scanning unit 12 appropriately outputs a transfer signal TRG, a reset signal RST, and a selection signal SEL to the plurality of control lines 311 to 313.

An anode electrode of the photodiode 21 is connected to a power supply on the low potential side (for example, ground). The photodiode 21 photoelectrically converts the received light into the photoelectric charges (here, photoelectron) having a charge amount according to the amount of the received light and accumulates the photoelectric charges. A cathode electrode of the photodiode 21 is electrically connected to a gate electrode of the amplifier transistor 24 via the transfer transistor 22. A region electrically connected to a gate electrode of the amplifier transistor 24 is the electric charge detection unit 26 for converting the electric charge into a voltage. The electric charge detection unit 26 is referred to as a floating diffusion/floating diffusion region/impurity diffusing region (FD) unit 26 below.

The transfer transistor 22 is connected between the cathode electrode of the photodiode 21 and the FD unit 26. The transfer signal TRG in which the high level (for example, $V_{dd}$ level) is active is applied from the row scanning unit 12 to a gate electrode of the transfer transistor 22 via the control line 311. The transfer transistor 22 responses to the transfer signal TRG and is in the conductive state so that the transfer signal TRG is photoelectrically converted by the photodiode 21, and the accumulated photoelectric charges are transferred to the FD unit 26.

A drain electrode of the reset transistor 23 is connected to a power supply line 34 with a voltage $V_{dd}$, and a source electrode is connected to the FD unit 26. To a gate electrode of the reset transistor 23, the reset signal RST in which the high level is active is applied from the row scanning unit 12 via the control line 312. The reset transistor 23 responses to the reset signal RST and is in the conductive state and resets the FD unit 26 by discarding the electric charges of the FD unit 26 to the power supply line 34.

The gate electrode of the amplifier transistor 24 is connected to the FD unit 26, and a drain electrode is connected to the power supply line 34. The amplifier transistor 24 is an input unit of a source follower which is a read circuit for reading the signal obtained by the photoelectric conversion by the photodiode 21. That is, a source electrode of the amplifier transistor 24 is connected to the column signal line 32 via the selection transistor 25 so as to configure a current source 35 connected to one end of the column signal line 32 and the source follower.

For example, a drain electrode of the selection transistor 25 is connected to the source electrode of the amplifier transistor 24, and a source electrode is connected to the column signal line 32. To a gate electrode of the selection transistor 25, the selection signal SEL in which the high level is active is applied from the row scanning unit 12 via the control line 313. The selection transistor 25 responses to the selection signal SEL and is in the conductive state so as to turn the state of the unit pixel 20 into a selection state and to transmit a signal output from the amplifier transistor 24 to the column signal line 32.

The selection transistor 25 can employ a circuit configuration connected between the power supply line 34 and the drain electrode of the amplifier transistor 24. Furthermore, in the present example, as a pixel circuit of the unit pixel 20, a 4Tr configuration, that is, a configuration including four transistors (Tr), i.e., the transfer transistor 22, the reset transistor 23, the amplifier transistor 24, and the selection transistor 25 is exemplified. However, the pixel circuit is not limited to this. For example, a 3Tr configuration can be used in which the selection transistor 25 is omitted and the amplifier transistor 24 has the function of the selection transistor 25, and the number of transistors can be increased as necessary.

[Grouping of Unit Pixels]

Figure 3A:
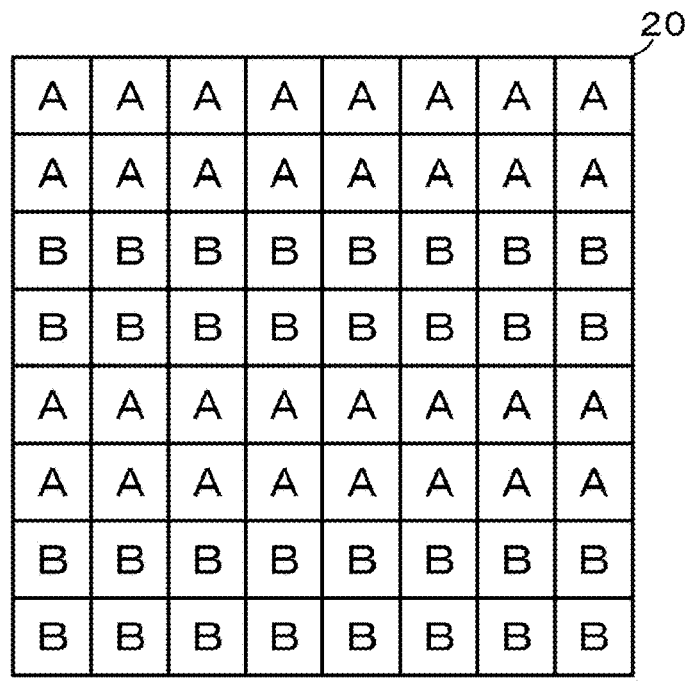
FIG. 3A is a diagram of a first example of pixel grouping.
Figure 3B:
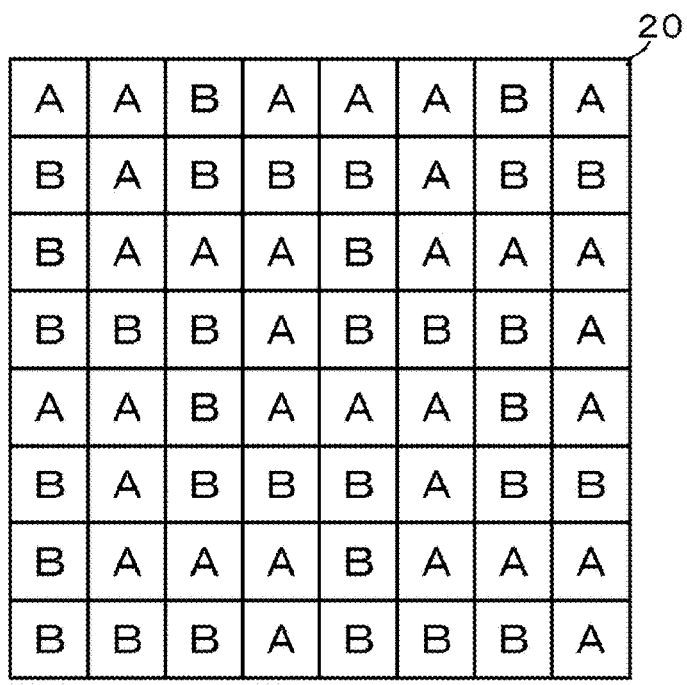
FIG. 3B is a diagram of a second example of pixel grouping.

In the CMOS image sensor 10 in which the unit pixels 20 having the above-described configuration are arranged in a matrix form, in the present embodiment, the unit pixels 20 are grouped into a plurality of pixel groups so as to image a scene with a high dynamic range without saturation (without halation) and without causing blackening. Here, as an example, a single pixel 20 of the pixel array unit 11 is grouped into two (two kinds of) pixel groups A and B. A method of setting the pixel groups is arbitrary. A first example of pixel grouping is illustrated in FIG. 3A, and a second example of pixel grouping is illustrated in FIG. 3B. In FIGS. 3A and 3B, it is assumed that pixels 20 having the same character (A or B) in the pixel 20 form the same pixel group.

In the pixel grouping in the first example illustrated in FIG. 3A, the pixel groups A and the pixel groups B are alternately arranged by two rows. In the pixel grouping in the second example illustrated in FIG. 3B, in correspondence with the red (R), green (G), blue (B) Bayer arrangement, the four pixels vertically and horizontally adjacent to each other are collectively grouped as a unit, and RGB is isotropically distributed into the pixel groups A and B. That is, in the pixel grouping in the first example and the pixel grouping in the second example, the pixels are grouped so that the number of pixels in the pixel groups A is equal to the number of pixels in the pixel groups B.

In a case of the pixel grouping in the second example in which the pixel groups A and the pixel groups B are mixed in the same pixel row, two row control lines 31 are provided in correspondence to the pixel group A and the pixel group B. The row control line 31 transmits the control signal used to perform control when a signal is read from the unit pixel 20.

[Multiple Exposures within Single Vertical Synchronization Period]

As described above, in the CMOS image sensor 10 in which the pixels 20 in the pixel array unit 11 are grouped into the plurality of pixel groups (in this example, two kinds of pixel groups A and B), in the present embodiment, the timing controller 16 (refer to FIG. 1) performs control as follows. That is, the timing controller 16 independently sets the exposure start timing and the exposure end timing for each of the plurality of pixel groups so that at least one pixel group of the plurality of pixel groups is exposed a plurality of times within a single vertical synchronization period.

The single vertical synchronization period is a single display frame period. In addition, in the pixel circuit illustrated in FIG. 2, the exposure start timing is a timing of discarding (reset) the photoelectric charge of the photodiode 21 through the FD unit 26 and newly starting exposure. The exposure end timing is a timing of ending the exposure triggered by the change of the state of the transfer transistor 22 into a conductive state, transferring the photoelectric charge photoelectrically converted by the photodiode 21 to the FD unit 26, and reading the photoelectric charge as the pixel signal to the column signal line 32 via the amplifier transistor 24 (signal read timing).

[Example of Exposure Sequence]

Figure 4:
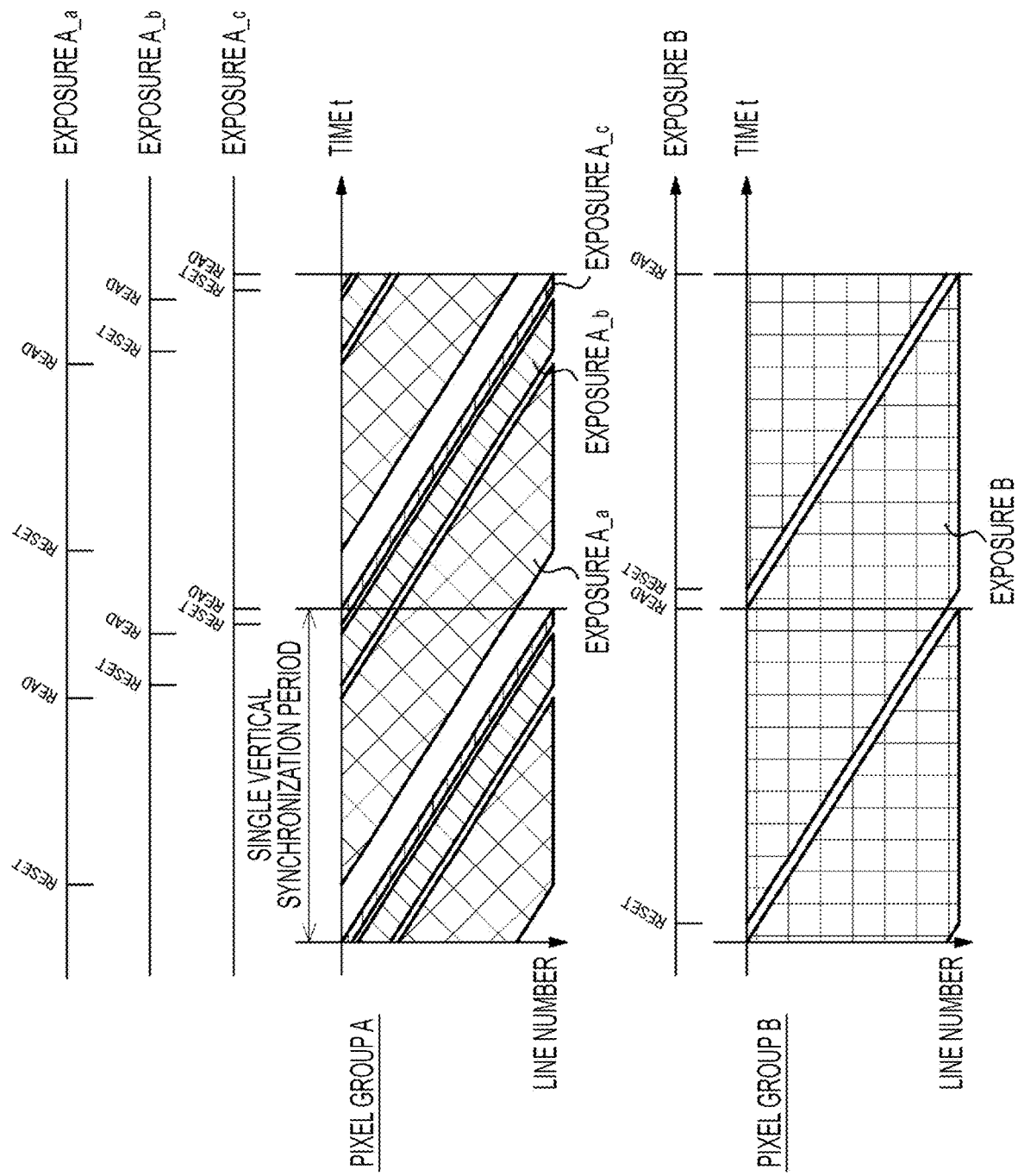
FIG. 4 is a diagram of an example of an exposure sequence (exposure sequence 1) according to the present embodiment, which is executed under control of a timing controller.

An example of an exposure sequence according to the present embodiment (referred to as "exposure sequence 1" below), which is executed under control of the timing controller 16, will be described with reference to FIG. 4. FIG. 4 is a diagram of an example of the exposure sequence (exposure sequence 1) according to the present embodiment, which is executed under the control of the timing controller 16.

In the exposure sequence 1, under the control of the timing controller 16, the pixel group A is exposed three times within the single vertical synchronization period, and the pixel group B is exposed once in the single vertical synchronization period. The exposures which are performed to the pixel group A three times are referred to as an exposure $A_a$, an exposure $A_b$, and an exposure $A_c$ from the one of which the exposure start timing is earlier, and the exposure performed to the pixel group B once is referred to as an exposure B.

Each of the exposures $A_a$ to $A_c$ is an exposure performed by a rolling shutter method, and an exposure start (RESET), an exposure end and signal read (READ) are sequentially performed from the one with a smaller line number (row number). At this time, before the exposure $A_a$ finishes reading the final line (row), the exposure end and signal read of first rows of the exposure $A_b$ and the exposure $A_c$ are started. That is, the exposure end timings of the three exposures $A_a$, $A_b$, and $A_c$ are set close to each other so that the exposure end timings are temporally overlapped with each other.

Figure 5:
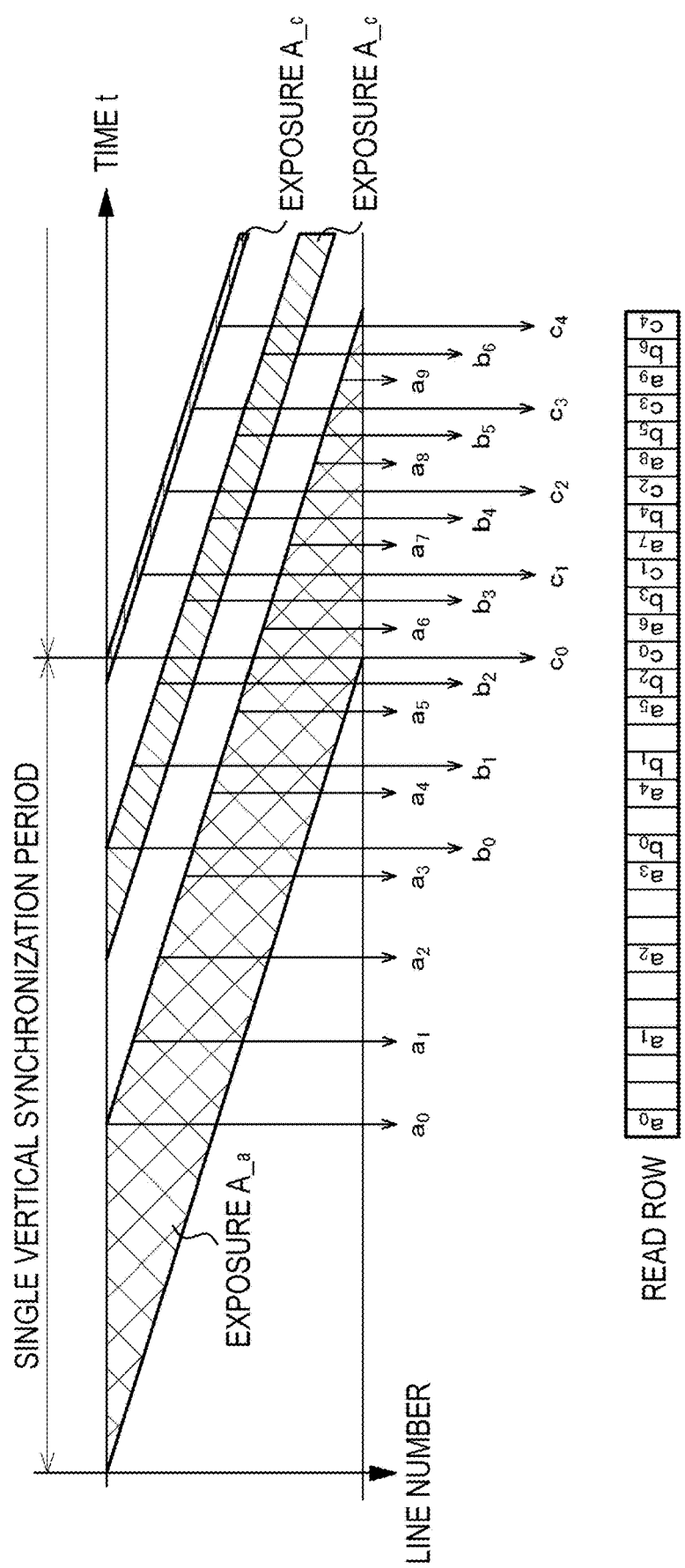
FIG. 5 is a diagram of a reading sequence of pixel value data of a pixel group A in a case of the present embodiment.

When the plurality of exposure images is read in the overlapped period, pixel value data of the exposure image in each exposure time is output in a time division manner. FIG. 5 shows a reading sequence of the pixel value data of the pixel group A in a case of the exposure sequence 1. In FIG. 5, each of the references $a_0, a_1, a_2, \ldots, B_0, b_1, b_2, \ldots, C_0, c_1$, and $c_2$ represents pixel value data of each row read from each exposure image of the exposures $A_a$, $A_b$, and $A_c$, and the subscript number corresponds to the line number. First, the pixel value data of the rows $a_0, a_1, a_2, \ldots$ of the exposure image of the exposure $A_a$ is sequentially read. The pixel value data of the first read row $b_0$ of the exposure image of the exposure $A_b$ is read in a time division manner following to the read row $a_3$ of the exposure image of the exposure $A_a$. The pixel value data of the exposure image of the exposure $A_c$ is read in a time division manner similarly to the reading of the pixel value data of each of the exposure images of the exposure $A_a$ and the exposure $A_b$.

Through the exposure sequence 1 described above, it is possible to perform four kinds of exposures including three times of exposures at close time intervals to the pixel group A and the long-time exposure to the pixel group B.

As described above, according to the CMOS image sensor 10 according to the present disclosure, at least the single pixel group of the grouped pixel groups is exposed a plurality of times within the single vertical synchronization period, and the exposure sequences are spatially set in parallel so that an exposure time ratio between the exposure images can be set close to each other. As a result, the exposure time ratio between the plurality of exposure images can be set close to each other. Therefore, a scene with a high dynamic range can be imaged without deteriorating a spatial resolution. Then, the scene with the high dynamic range can be imaged without saturation (without halation) and without causing blackening.

Furthermore, since the number of pixels belonging to the pixel group A is ½ of the total number of pixels, it is preferable that the number of A/D converters 40 required for realizing the exposure sequence 1 be twice of that in a normal read method of reading all the pixels once in the single vertical synchronization period. That is, in the pixel group A, since half of the all pixels are spatially exposed three times, half of the pixels are driven triple times (=½×3), and in the pixel group B, since half of the all the pixels are spatially exposed once, half of the pixels are driven one time (=½×1). Therefore, in a case of the exposure sequence 1, the A/D converters 40 of which the number is twice (=½×3+½×1) of that in the normal reading method of reading all the pixels once within the single vertical synchronization period are required.

Furthermore, the A/D converters 40 as many as that in the normal reading method of reading the all the pixels once in the single vertical synchronization period are provided, and the A/D converters are driven at higher speed than the normal speed at the time of A/D conversion. With this method, the plurality of exposure images can be read within the single vertical synchronization period. That is, since the pixel group A is exposed three times, and the pixel group B is exposed once, desired four kinds of exposures can be performed by driving the A/D converters 40 at a speed twice (=½×3+½×1) of the speed at the time of normal reading.

Incidentally, in a case where exposure is uniformly performed to all the pixels four times within the single vertical synchronization period, all the pixels are A/D converted. Therefore, it is necessary to drive the A/D converters 40 of which the number is four times of the above case or drive the A/D converters 40 at a speed four times higher than the above case. In consideration of this, according to the exposure sequence 1, four exposure images can be obtained while reducing the cost to configure the system. Furthermore, according to the technology of the present disclosure, since an increase in the number of A/D converters 40 can be suppressed to the minimum when the scene with the high dynamic range is imaged, power consumption of the A/D converters 40 in the whole CMOS image sensor 10 can be reduced.

As described above, by reading the plurality of exposure images in the temporally overlapped period in a time division manner (time division reading), providing more A/D converters 40 than the normal reading, and dispersively using the A/D converters 40, the plurality of exposure images can be read within the single vertical synchronization period. Note that, in this case, the plurality of A/D converters 40 is arranged for the single pixel column. However, the configuration is not limited to this. That is, as another example, by reading the plurality of exposure images in the temporally overlapped period in a time division manner, providing the A/D converters 40 as many as that at the time of normal reading, and driving the A/D converters 40 at high speed, the plurality of exposure images can be read within the single vertical synchronization period.

[Example of Arranging a Plurality of A/D Converters for Single Pixel Column]

Here, the CMOS image sensor 10 which performs the exposures plurality of times in the plurality of pixel groups by arranging the plurality of A/D converters 40 for the single pixel column and using the A/D converters 40 in parallel will be described. Here, as described above, an example will be described in a case where two kinds of pixel groups A and B are set regarding the unit pixels 20 of the pixel array unit 11 and the pixel group A is exposed three times within the single vertical synchronization period. Furthermore, the pixels are grouped as in the first example illustrated in FIG. 3A.

Figure 6:
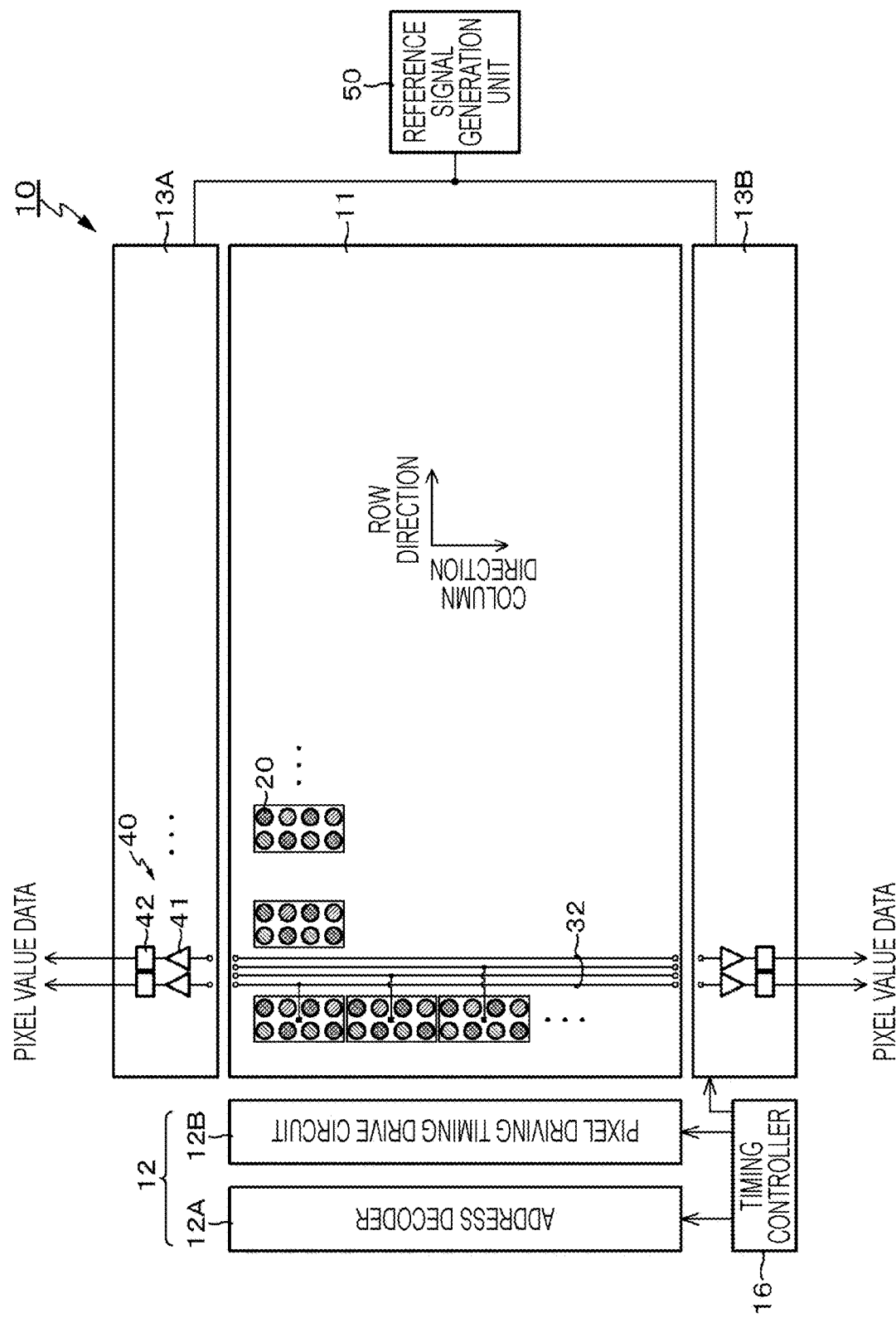
FIG. 6 is a schematic diagram of a configuration of a CMOS image sensor in which a plurality of A/D converters is arranged for a single pixel column and the A/D converters are used in parallel.

FIG. 6 is a schematic diagram of a configuration of the CMOS image sensor 10 in which the plurality of A/D converters 40 is arranged for a single pixel column and the A/D converters 40 are used in parallel. Here, a configuration is exemplified in which the column processing units 13 (13A and 13B) including the A/D converters 40 are arranged above and below the pixel array unit 11. Four column signal lines 32 are arranged for each pixel column formed with a width of two pixels, and the four A/D converters 40 are arranged in total. The two A/D converters 40 are arranged on the upper side of the pixel array unit 11 and the other two A/D converters 40 are arranged on the lower side.

The A/D converter 40 includes a comparator 41 and a counter 42. The comparator 41 uses a reference signal with a slope-shaped waveform as a reference input and uses the analog pixel signal output from each unit pixel 20 of the pixel array unit 11 as a comparison input and compares the reference input and the comparison input with each other.

The reference signal to be the reference input of the comparator 41 is generated by a reference signal generation unit 50 including a D/A converter and the like. The counter 42 converts the analog pixel signal into digital data (pixel value data) by performing a counting operation over a period from start of the comparison operation to the end of the comparison operation by the comparator 41 in synchronization with a predetermined clock.

Although not illustrated in FIG. 6, a connection switch 60 (refer to FIG. 8) which is separately provided connects the four column signal lines 32 provided in correspondence with the two pixel columns and the four A/D converters 40 in total, i.e., two A/D converters 40 provided on the upper side of the pixel array unit 11, and the other two provided on the lower side. The connection switch 60 can arbitrarily change the connection relationship between the four column signal lines 32 and the four A/D converters 40 on the basis of a register setting value. Furthermore, it is assumed that the pixels 20 of the pixel array unit 11 shares a connection to the column signal line 32 in units of four rows×two columns.

In FIG. 6, groups of the four-row and two-column unit pixels 20 respectively surrounded by rectangles are illustrated. This group indicates a unit which shares the connection with the four column signal lines 32 provided in correspondence to the two pixel columns. The row scanning unit 12 includes an address decoder 12A and a pixel driving timing drive circuit 12B. The address decoder 12A operates on the basis of an address signal applied from the timing controller 16. The pixel driving timing drive circuit 12B operates on the basis of a drive timing signal applied from the timing controller 16 and transmits a signal for applying a shutter timing to each pixel 20 and a signal for applying a reading timing on the basis of a control signal applied from the address decoder 12A.

Figure 7:
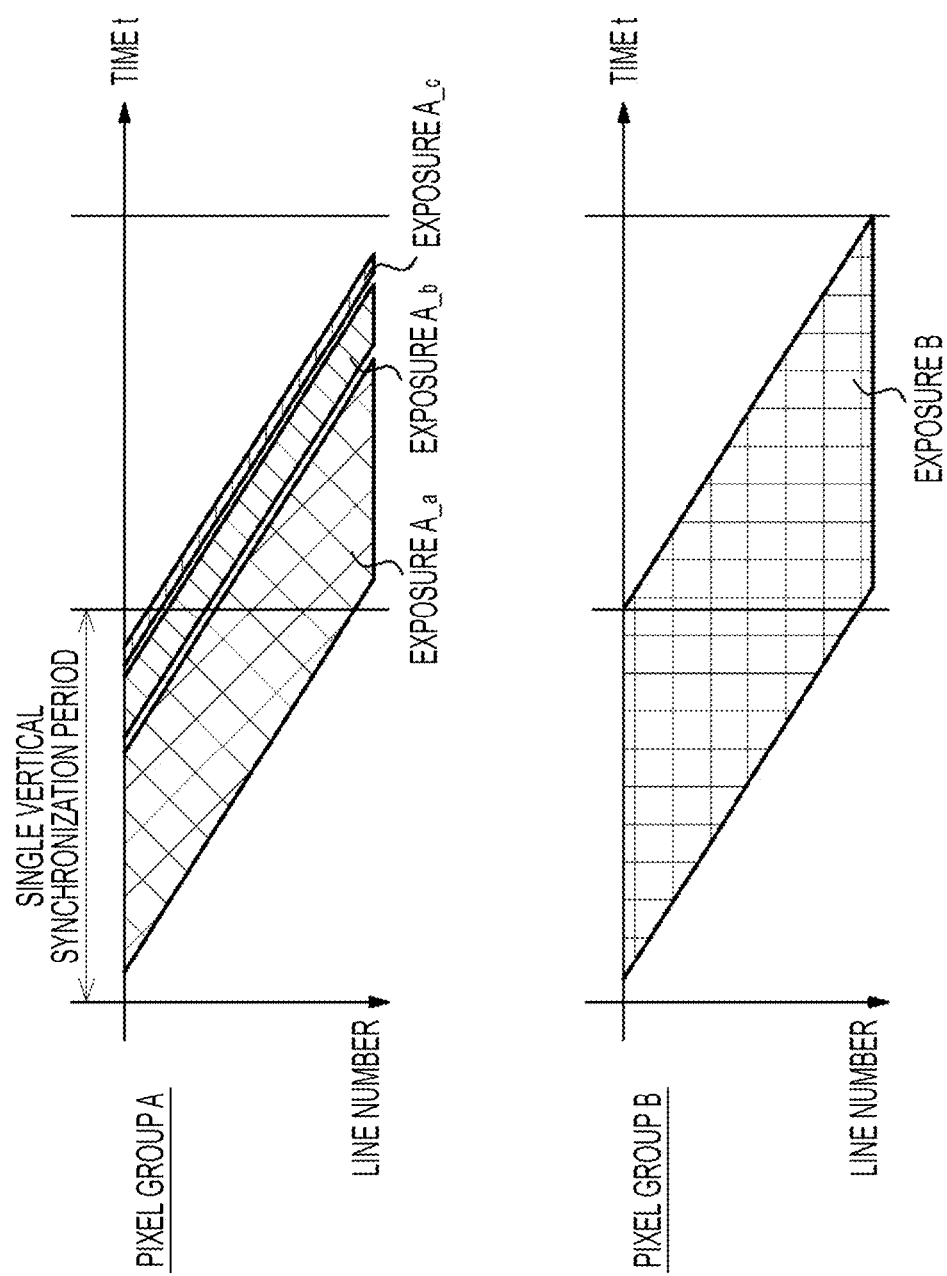
FIG. 7 is a diagram of a portion corresponding to a single vertical synchronization period (single display frame) in the exposure sequence according to the present embodiment.

FIG. 7 is a diagram illustrating a portion corresponding to the single vertical synchronization period (single display frame) of the exposure sequence 1 (refer to FIG. 4). Hereinafter, how to use the A/D converter 40 necessary for realizing the exposure sequence illustrated in FIG. 7 will be described.

Figure 8:
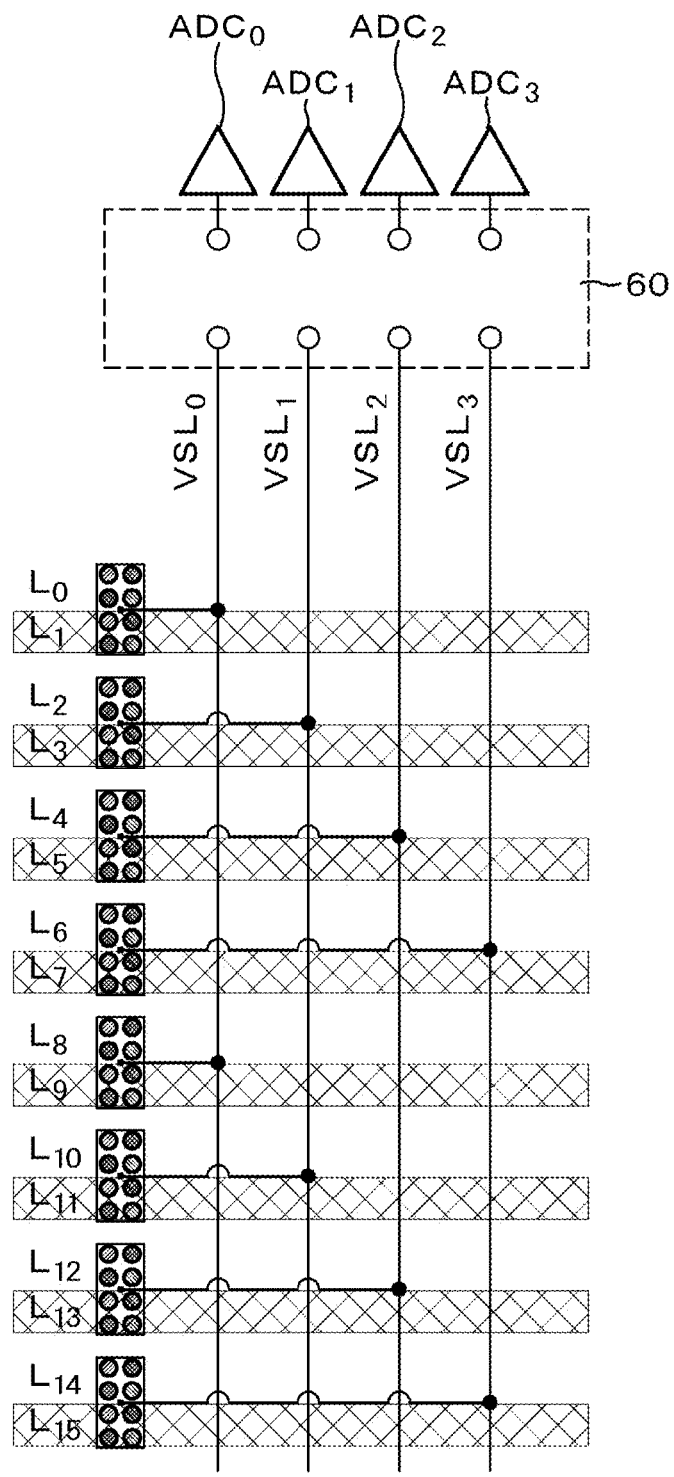
FIG. 8 is a diagram in which certain two pixel columns in a pixel array unit and a column signal line and an A/D converter corresponding to the pixel columns are extracted and illustrated.

In FIG. 8, two pixel columns in the pixel array unit 11 and the column signal lines 32 ($VSL_0$, $VSL_1$, $VSL_2$, and $VSL_3$) and the A/D converters 40 ($ADC_0$, $ADC_1$, $ADC_2$, and $ADC_3$) corresponding to the two pixel columns are extracted and illustrated. In FIG. 8, two rows are grouped together as a row L, and the rows L are denoted with reference numbers ($L_0$, $L_1$, ... ). Furthermore, it is assumed that rows ($L_0$, $L_2$, ... ) which are not shaded correspond to the pixel groups A and shaded rows ($L_1$, $L_3$, ... ) correspond to the pixel groups B.

For convenience of explanation, in FIG. 8, the four A/D converters 40 ($ADC_0$, $ADC_1$, $ADC_2$, and $ADC_3$) are collectively illustrated on the upper side of the pixel array unit 11. Here, the A/D converter $ADC_0$ reads a pixel value of exposure $A_{-a}$, the A/D converter $ADC_1$ reads a pixel value of exposure $A_{-b}$, the A/D converter $ADC_2$ reads a pixel value of exposure $A_{-c}$, and the A/D converter $ADC_3$ reads a pixel value of exposure B. As illustrated in FIG. 8, the connection switch 60 for connecting the column signal lines 32 and the A/D converters 40 is provided between the column signal lines 32 ($VSL_0$, $VSL_1$, $VSL_2$, and $VSL_3$) and the A/D converters 40 ($ADC_0$, $ADC_1$, $ADC_2$, and $ADC_3$).

In this example, in a process of reading the pixel values of the rows, a desired exposure sequence is realized by sequentially switching the connections of the connection switch 60. For convenience of explanation, it is assumed that a time needed until the pixel values of 1 L (two rows) are read by all the exposures be one, the reading timings are referred to as t=0, 1, 2 . . . .

In Table 1, a process of changing the connections of the connection switch 60 when the pixel values of the rows are sequentially read is illustrated. In a row of VSL_SW_ADC$_0$, a number of the column signal line 32 connected to the ADC$_0$ at each timing is described. This is similarly applied to VSL_SW_ADC$_1$, VSL_SW_ADC$_2$, and VSL_SW_ADC$_3$.

TABLE 1

| | READING TIMING | | | | |
|---|---|---|---|---|---|
| | t = 0 | t = 1 | t = 2 | t = 3 | t = 4 |
| VSL_SW_ADC$_0$ | VSL$_2$ | VSL$_3$ | VSL$_0$ | VSL$_1$ | VSL$_2$ |
| VSL_SW_ADC$_1$ | VSL$_3$ | VSL$_0$ | VSL$_1$ | VSL$_2$ | VSL$_3$ |
| VSL_SW_ADC$_2$ | VSL$_1$ | VSL$_2$ | VSL$_3$ | VSL$_0$ | VSL$_1$ |
| VSL_SW_ADC$_3$ | VSL$_0$ | VSL$_1$ | VSL$_2$ | VSL$_3$ | VSL$_0$ |

Figure 9:
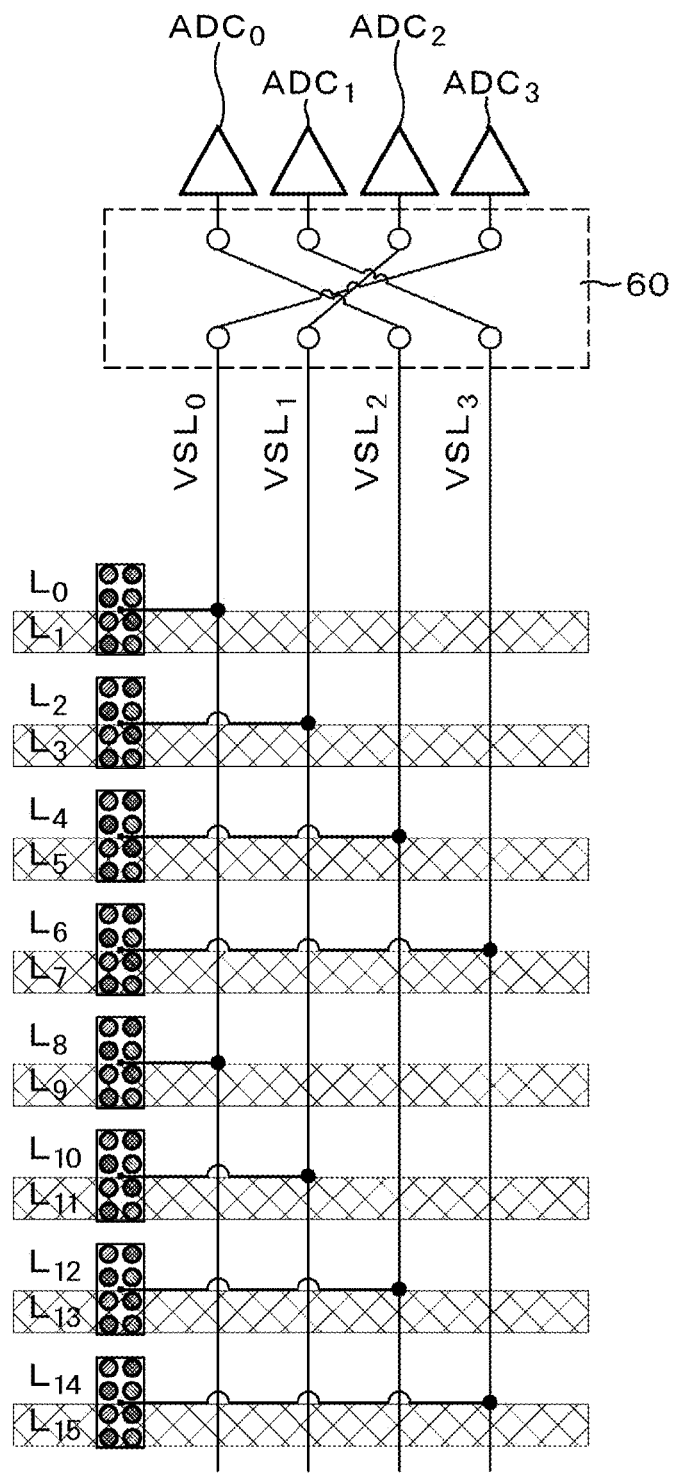
FIG. 9 is a diagram of a connection state between the column signal line and the A/D converter at a reading timing t=0.
Figure 10:
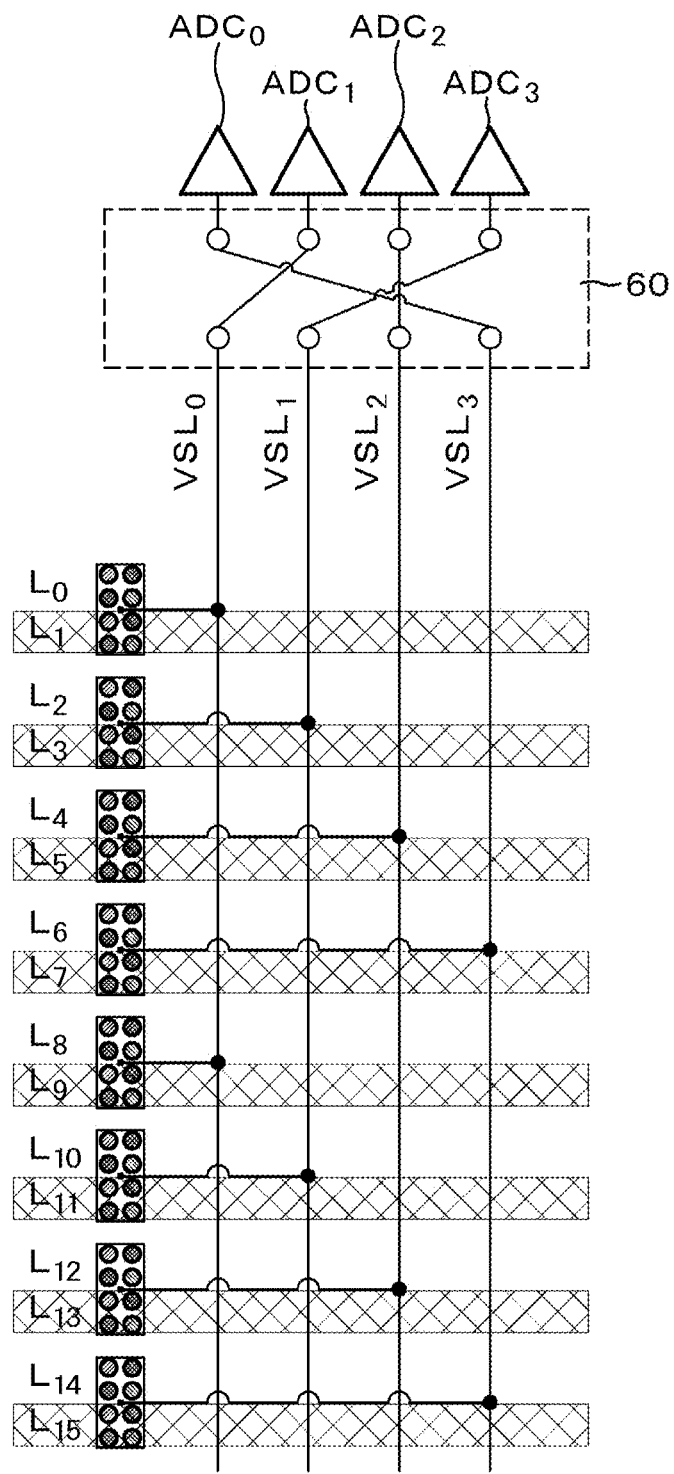
FIG. 10 is a diagram of a connection state between the column signal line and the A/D converter at a reading timing t=1.
Figure 11:
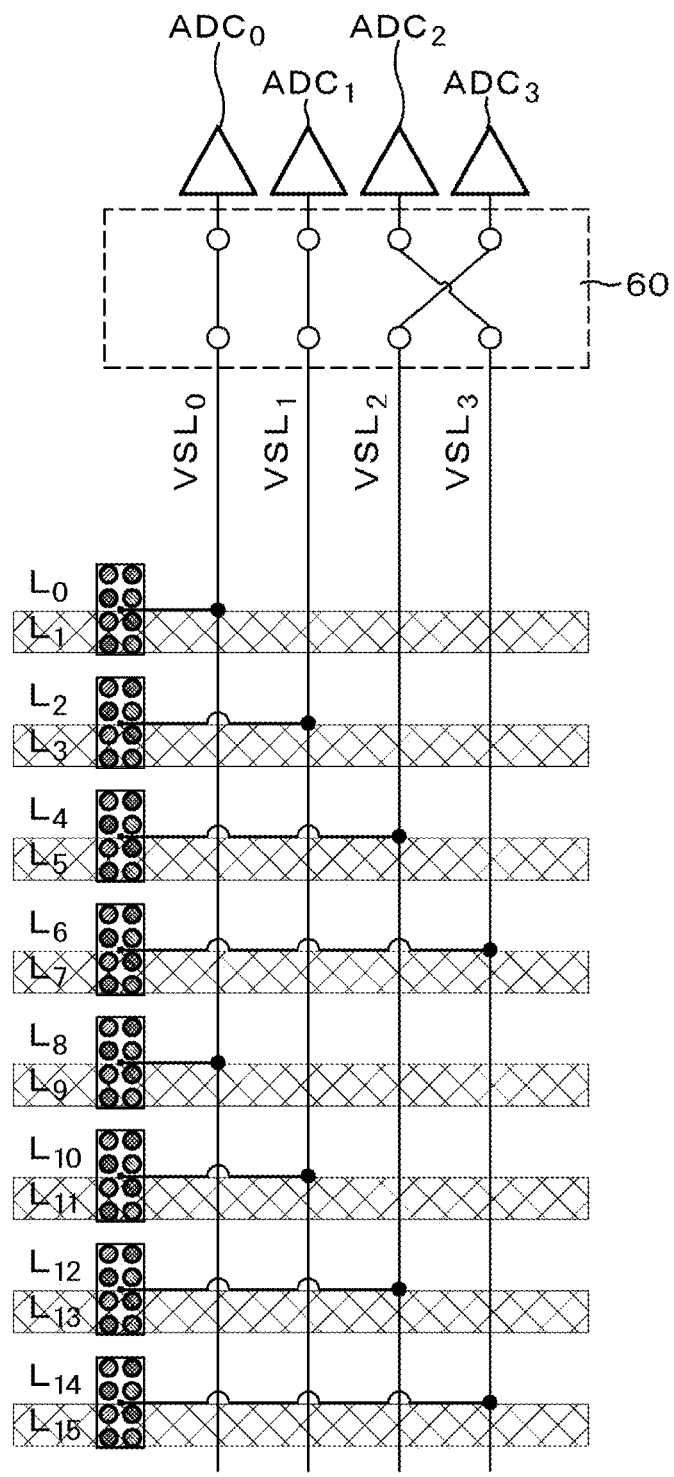
FIG. 11 is a diagram of a connection state between the column signal line and the A/D converter at a reading timing t=2.

In FIGS. 9 to 11, the connection state between the column signal lines 32 (VSL$_0$, VSL$_1$, VSL$_2$, and VSL$_3$) and the A/D converters 40 (ADC$_0$, ADC$_1$, ADC$_2$, and ADC$_3$) which changes according to the change of the connections of the connection switch 60 at the reading timings t=0, 1, and 2. In Table 2, row numbers of the rows of which the pixel value are read at each reading timing are indicated. At each reading timing, reading signals are generated by the pixel driving timing drive circuit 12B (refer to FIG. 6) relative to four rows L.

TABLE 2

| | READING TIMING | | | | |
|---|---|---|---|---|---|
| | t = 0 | t = 1 | t = 2 | t = 3 | t = 4 |
| NUMBER OF ROWS TO BE READ | L$_{12}$ | L$_{14}$ | L$_{16}$ | L$_{18}$ | L$_{20}$ |
| | L$_6$ | L$_8$ | L$_{10}$ | L$_{12}$ | L$_{14}$ |
| | L$_2$ | L$_4$ | L$_6$ | L$_8$ | L$_{10}$ |
| | L$_1$ | L$_3$ | L$_5$ | L$_7$ | L$_9$ |

Here, as an example, a process of reading the pixel value at the reading timing t=0 will be examined. From Table 2, the rows read at the reading timing t=0 are rows L12, L6, L2, and L1. Of the above rows, the row L1 belonging to the pixel group B is connected to the column signal line VSL$_0$, and the column signal line VSL$_0$ is connected to the A/D converter ADC$_3$ at the reading timing t=0. Therefore, the pixel value of the row L1 is read as the pixel value of the exposure B (FIG. 9).

Similarly, at the reading timing t=0, the row L12 is connected to the A/D converter ADC$_0$ via the column signal line VSL$_2$, the row L6 is connected to the A/D converter ADC$_1$ via the column signal line VSL$_3$, and the row L2 is connected to the A/D converter ADC$_2$ via the column signal line VSL$_1$. Then, the pixel values are respectively read as the exposure A$_a$, exposure A$_b$, and exposure A$_c$.

At the following reading timing t=1, the rows L14, L8, L4, and L3 are read. Of the rows, the row L3 belonging to the pixel group B is connected to the A/D converter ADC$_3$ via the column signal line VSL$_1$. Therefore, the pixel value of the row L3 is read as the pixel value of the exposure B (FIG. 10). Similarly, the row L14 is connected to the A/D converter ADC$_0$ via the column signal line VSL$_3$, the row L8 is connected to the A/D converter ADC$_1$ via the column signal line VSL$_0$, and the row L4 is connected to the A/D converter ADC$_2$ via the column signal line VSL$_2$. Then, the pixel values are respectively read as the exposure A$_a$, exposure A$_b$, and exposure A$_c$.

At the reading timing t=2 and the subsequent reading timings, by operating the connection switch 60 as illustrated in Table 1, an operation for reading the pixel values of the exposure A$_a$, the exposure A$_b$, the exposure A$_c$, the exposure B from the A/D converters 40 (ADC$_0$, ADC$_1$, ADC$_2$, and ADC$_3$) can be performed (FIG. 11).

Figure 12:
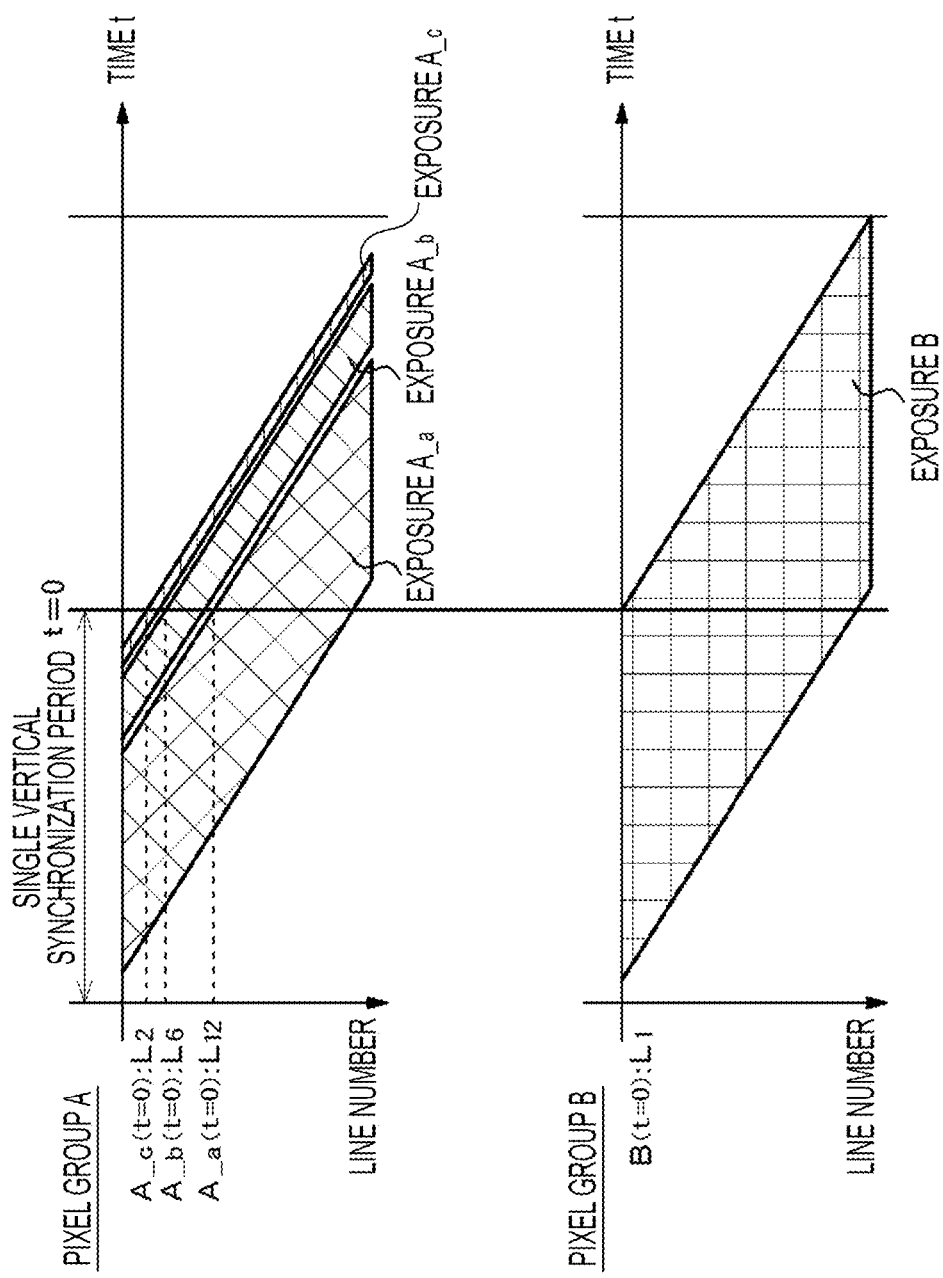
FIG. 12 is a diagram of row numbers read as an exposure image at the reading timing t=0.
Figure 13:
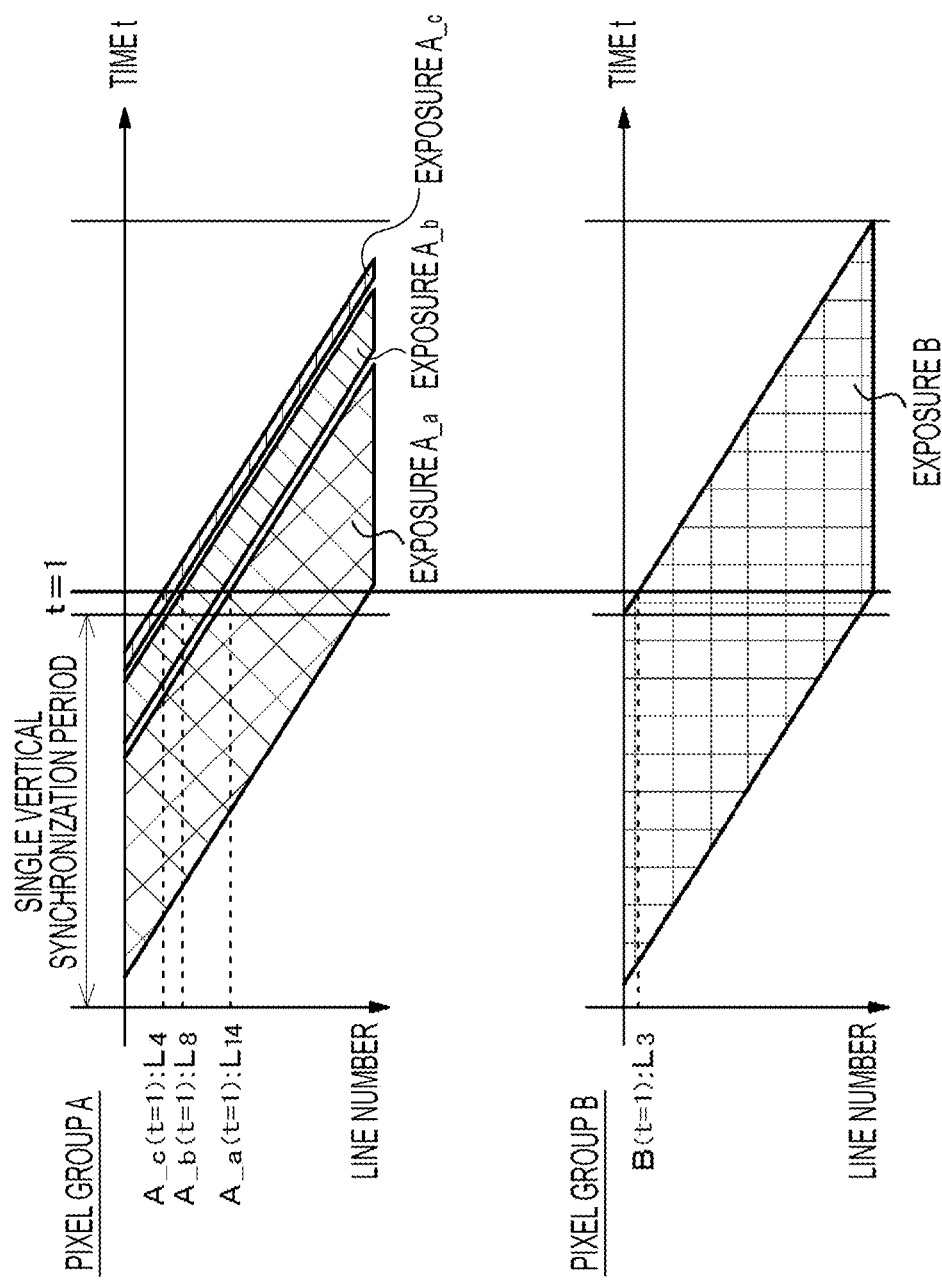
FIG. 13 is a diagram of row numbers read as an exposure image at the reading timing t=1.
Figure 14:
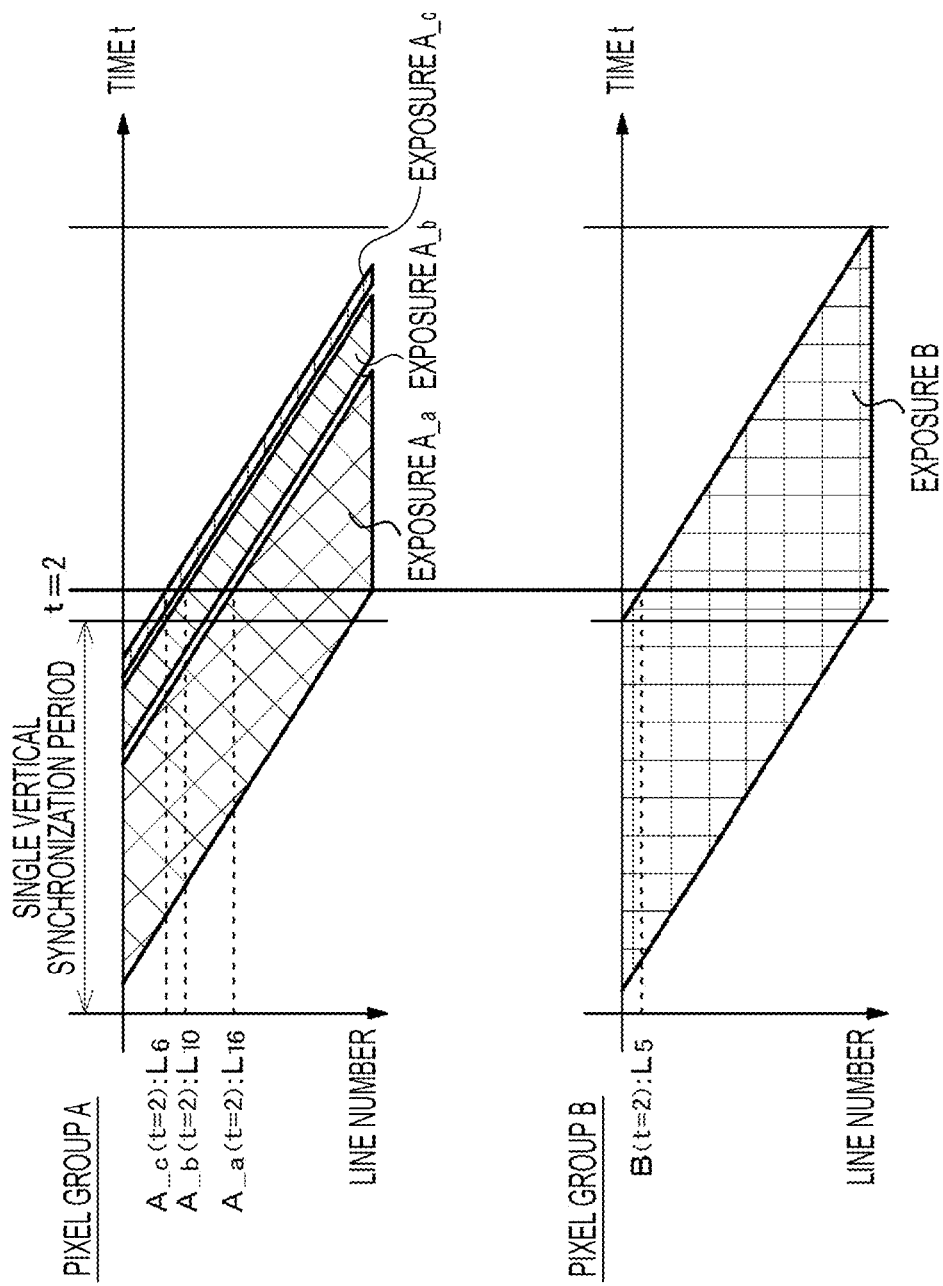
FIG. 14 is a diagram of row numbers read as an exposure image at the reading timing t=2.

In FIGS. 12 to 14, numbers of rows read as the exposure images at the respective reading timings t=0, 1 and 2 are illustrated. From FIGS. 12 to 14, it can be found that an operation of reading the pixel values is performed as illustrated in the exposure sequence diagram in FIG. 7.

As described above, by concurrently reading the plurality of exposure images in the temporally overlapped period (concurrent reading), providing more A/D converters 40 than the normal reading, and dispersively using the A/D converters 40, the plurality of exposure images can be read within the single vertical synchronization period.

In this example, the pixel units which share the column signal line 32, the number of column signal lines 32, the number of A/D converters 40 provided in parallel, and the like are specifically described. However, it is not necessary to set the numbers in this way. For example, it is preferable that a unit of the pixels for sharing the column signal line 32 be pixels of two rows and two columns or a single pixel. Furthermore, the connection between the pixels 20 and the column signal line 32 is not limited to the connection described in this example, and a configuration may be used in which the pixel rows are connected to the appropriate A/D converter 40 to realize the desired exposure sequence.

Furthermore, in this example, the pixel value data read by each A/D converter 40 corresponds to each exposure data. However, this is not necessarily required. For example, by fixing the connection of the connection switch 60 through the process of reading the pixel value and appropriately executing processing such as appropriately switching the pixel value data after the data has been read from the A/D converter 40, the reading of the exposure data equivalent to this example can be realized.

[Modification]

In the above embodiment, the CMOS image sensor 10 having a flat structure illustrated in FIG. 1 is exemplified. However, a CMOS image sensor having a laminated structure may be used. Here, as illustrated in FIG. 1, the "flat structure" is a structure in which a peripheral circuit portion of the pixel array unit 11, that is, a driving unit for driving each pixel 20 of the pixel array unit 11, and a signal processing unit including the A/D converter 40 and the like are arranged on the semiconductor substrate 30 where the pixel array unit 11 is arranged.

Figure 15A:
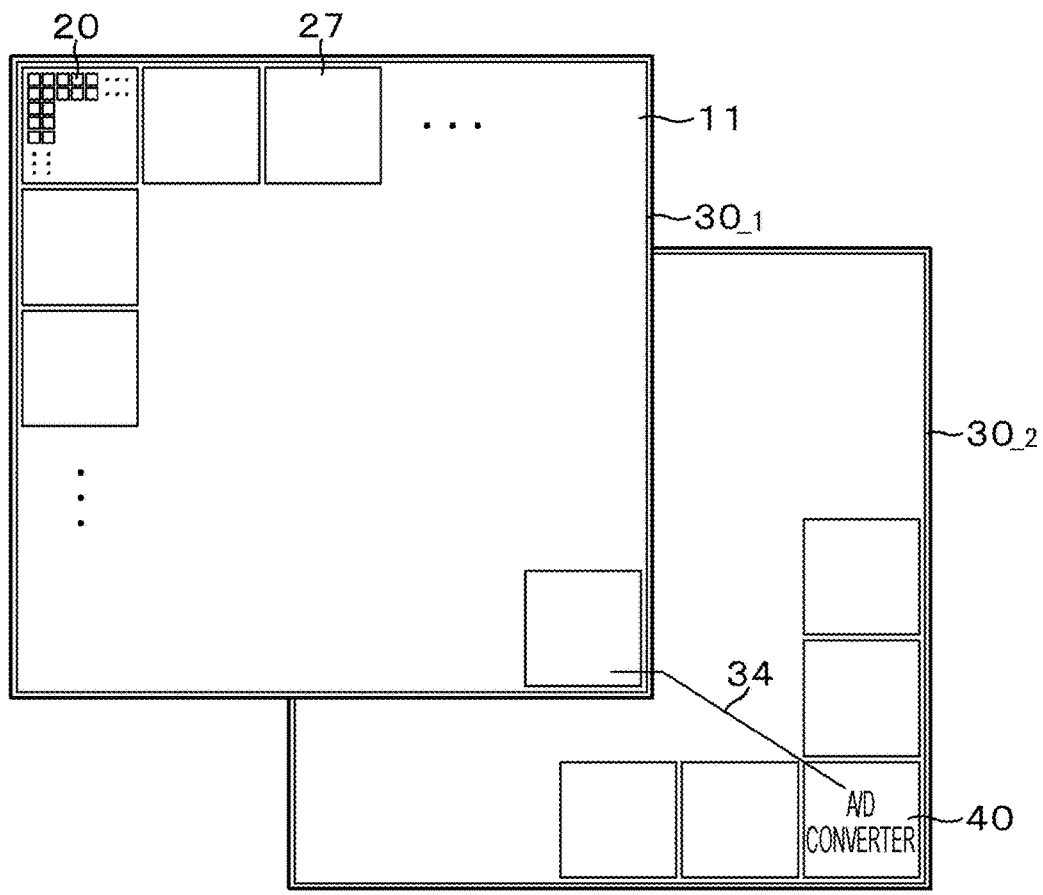
FIG. 15A is a diagram of a correspondence relationship between a unit pixel and an A/D converter in a case of being applied to a CMOS image sensor having a laminated structure.
Figure 15B:
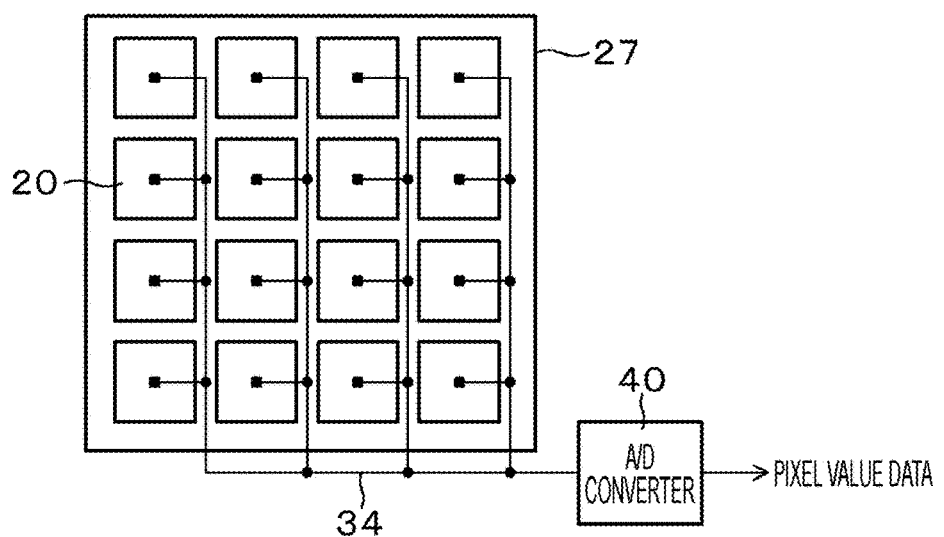
FIG. 15B is a diagram of electrical connection between pixels in a single pixel group and a corresponding A/D converter.

Furthermore, the "laminated structure" is a structure in which the pixel array unit 11 and the peripheral circuit portion are separately mounted on semiconductor substrates 30$_1$ and 30$_2$ and the semiconductor substrates 30$_1$ and 30$_2$ are laminated as illustrated in FIG. 15A. In a case where the laminated structure is employed, a configuration can be used in which the unit pixels 20 in the semiconductor substrate 30$_1$ on the side of the pixel array unit 11 are divided into regions with a predetermined size, each of the divided group is referred to as a pixel group 27, and the A/D converter 40 is arranged on the semiconductor substrate 30$_2$ for each pixel group 27. In this case, a single A/D converter 40 is shared by the plurality of unit pixels 20 adjacent to each other in the vertical direction and the horizontal direction in the pixel group 27. As illustrated in FIG. 15B, the pixels 20 in the single pixel group 27 are connected to the corresponding A/D converter 40 via the signal line 34. In FIG. 15B, a case where the pixel group 27 includes four pixels in the vertical direction×four pixels in the horizontal direction is illustrated.

Furthermore, as a pixel structure for taking incident light of the CMOS image sensor 10, when the side where a wiring layer is arranged is assumed as a front side, a front irradiation type pixel structure for taking the incident light from the front side may be used, and a back side irradiation type pixel structure for taking the incident light from the back side (opposite side of the side where wiring layer is arranged) may be used.

Furthermore, in the above embodiment, the CMOS image sensor has been described as an example of the solid-state imaging device according to the present disclosure. However, application of the present disclosure is not limited to the application to the CMOS image sensor. That is, the technology according to the present disclosure for grouping the unit pixels 20 and exposing at least a single pixel group of the plurality of pixel groups the plurality of times within the single vertical synchronization period can be similarly applied to a CCD image sensor.

<Imaging Device According to the Present Disclosure>

The CMOS image sensor 10 according to the above embodiment can be used as an imaging unit of an imaging device such as a digital still camera, a video camera, a monitoring camera, and an in-vehicle camera. It is preferable to use the CMOS image sensor 10 according to the present embodiment especially for the imaging device such as the monitoring camera and the in-vehicle camera so as to image the scene with the high dynamic range without saturation and without causing blackening.

[System Configuration]

Figure 16:
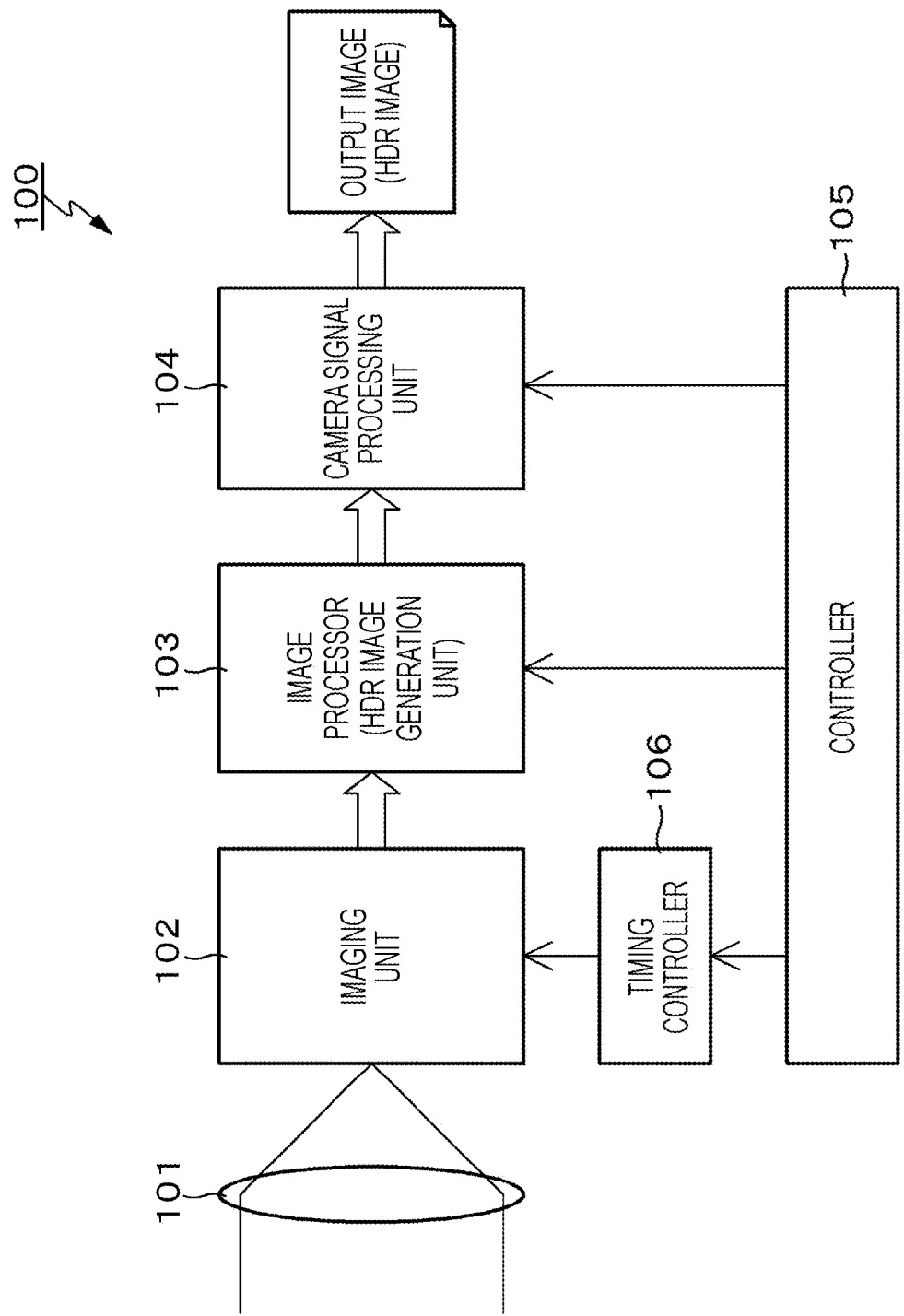
FIG. 16 is a block diagram of an exemplary configuration of an imaging device according to the present disclosure.

FIG. 16 is a block diagram of an exemplary configuration of an imaging device according to the present disclosure. As illustrated in FIG. 16, an imaging device 100 according to the present disclosure includes an optical lens 101, an imaging unit 102, an image processor 103, a camera signal processing unit 104, a controller 105, and a timing controller 106.

In FIG. 16, the optical lens 101 focuses image light (incident light) from a subject (not shown) on an imaging surface of the imaging unit 102. As the imaging unit 102, the CMOS image sensor 10 is used. In the CMOS image sensor 10, the unit pixels are grouped into the plurality of pixel groups.

As described above, in the CMOS image sensor 10, the exposure start timing and the exposure end timing are independently set relative to each of the plurality of pixel groups so that at least a single pixel group of the plurality of pixel groups is exposed a plurality of times within the single vertical synchronization period. Then, for example, under the exposure sequence 1, the CMOS image sensor 10 outputs image data of the exposure images of the three-times exposure, i.e., the exposure $A_a$, the exposure $A_b$, and the exposure $A_c$ of the pixel group A and the image data of the exposure image of the exposure B performed once to the pixel group B.

In the above-described example, the timing controller 16 is provided on the semiconductor substrate (chip) 30 of the CMOS image sensor 10. However, the timing controller 16 may be provided outside the semiconductor substrate 30. In the exemplary configuration in FIG. 16, a case where the timing controller 16 is provided outside the semiconductor substrate 30 is illustrated. That is, the timing controller 106 in FIG. 16 corresponds to the timing controller 16 in FIG. 1 and performs control to output image data for image data for each row in a time division manner regarding the plurality of exposure images of which the exposure end timings are temporally overlapped with each other.

The image processor 103 is an HDR image generation unit for generating an image with a high dynamic range (referred to as "HDR image" below) on the basis of the image data of the respective exposure images of the exposure $A_a$, the exposure $A_b$, and the exposure $A_c$ output from the CMOS image sensor 10 and the image data of the exposure image of the exposure B. The image processor 103 will be described later in detail. The camera signal processing unit 104 executes signal processing of a general camera such as white balance adjustment and gamma correction and generates an output image (HDR image).

The controller 105 includes, for example, a central processing unit (CPU), outputs a control signal to the image processor 103, the camera signal processing unit 104, and the timing controller 106 according to a program stored in a memory (not shown), and controls various processing.

As described above, in the CMOS image sensor 10, the exposure start timing and the exposure end timing are independently set relative to each of the plurality of pixel groups so that at least a single pixel group of the plurality of pixel groups is exposed a plurality of times within the single vertical synchronization period. Then, in the image processor 103, the image with a high dynamic range is generated on the basis of, for example, the image data of the exposure images of the exposure $A_a$, the exposure $A_b$, and the exposure $A_c$ performed three times in the pixel group A and the image data of the exposure image of the exposure B performed once in the pixel group B output from the CMOS image sensor 10.

With this structure, when the scene with a high dynamic range is captured, a plurality of exposures can be set within the single vertical synchronization period as making the exposure time ratio between the exposure images close to each other. Therefore, an imaging device can be realized with which an artifact regarding HDR synthesizing processing of each exposure image, for example, deterioration in the spatial resolution and a noise level difference caused by a difference in S/N between the exposure images hardly occurs.

Incidentally, it can be considered to use a method of setting a large exposure time ratio to capture the high dynamic range. However, with this method, since the exposure times are separated from each other, a degree of a burr in each image in a moving body region (moving body burr) largely varies, and it is difficult to execute the synthesizing processing. In addition, if the exposure times of the exposure images are separated, in most luminance regions, pixel phases having pixel values effective to a certain amount of the incident light are reduced, and the resolution is easily deteriorated.

On the other hand, in the imaging device 100, by performing the exposure plurality of times within the single vertical synchronization period and setting the exposure sequences spatially in parallel, the exposure times of the exposure images can be set close to each other regarding the scene with the high dynamic range. Therefore, the deterioration in the resolution hardly occurs. That is, according to the present imaging device 100, it is possible to suppress the deterioration in the resolution while capturing a scene with a high dynamic range.

In the present configuration example, a case in which the image processor 103 (refer to FIG. 16) for generating the HDR image is provided outside the CMOS image sensor 10 which is the imaging unit 102 has been described as an example. However, the image processor 103 can be provided in the CMOS image sensor 10. In this case, the CMOS image sensor 10 is a solid-state imaging device having the function of the image processor 103. Furthermore, in a case where the CMOS image sensor 10 has the laminated structure illustrated in FIG. 15A, since the image processor 103 can be mounted on the semiconductor substrate $30_2$ where the A/D converter 40 is arranged, there is an advantage such that the image processor 103 can be provided inside without increasing the chip size.

Hereinafter, specific embodiments of image processing executed by the image processor 103 under a predetermined exposure sequence will be described. The configuration of the image processor 103 is different for each embodiment. The image processors 103 according to the first and fourth embodiments execute the image processing under the exposure sequence 1, and the image processors 103 according to the second and third embodiments execute image processing under an exposure sequence 2 to be described later.

(First Embodiment)

Figure 17:
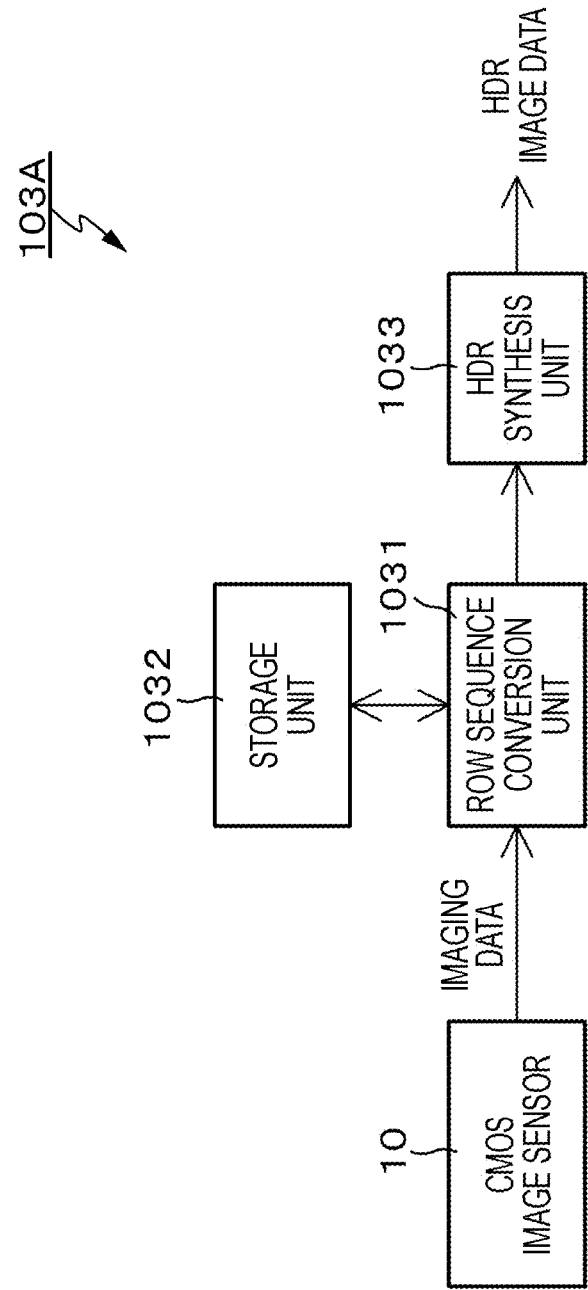
FIG. 17 is a block diagram of an exemplary configuration of an image processor according to a first embodiment.

FIG. 17 is a block diagram of an exemplary configuration of an image processor 103A according to a first embodiment. As illustrated in FIG. 17, an image processor 103A according to the first embodiment includes a row sequence conversion unit 1031, a storage unit 1032, and an HDR synthesis unit 1033 as a first image synthesis unit.

The row sequence conversion unit 1031 holds pixel value data of exposure images, of which an exposure order is not last within a single vertical synchronization period, in the same pixel group in the storage unit 1032 for each row. Then, the row sequence conversion unit 1031 reads the pixel value data of the same row from the storage unit 1032 according to an output timing of pixel value data of an exposure image which is exposed last within the single vertical synchronization period for each row. Through the processing by the row sequence conversion unit 1031, the pixel value data of the plurality of exposure pixels is output as aligning the rows.

The HDR synthesis unit 1033 as the first image synthesis unit generates HDR image data by synthesizing the pixel value data of the plurality of exposure pixels output from the row sequence conversion unit 1031 as aligning the rows, between the plurality of exposure pixels.

Figure 18:
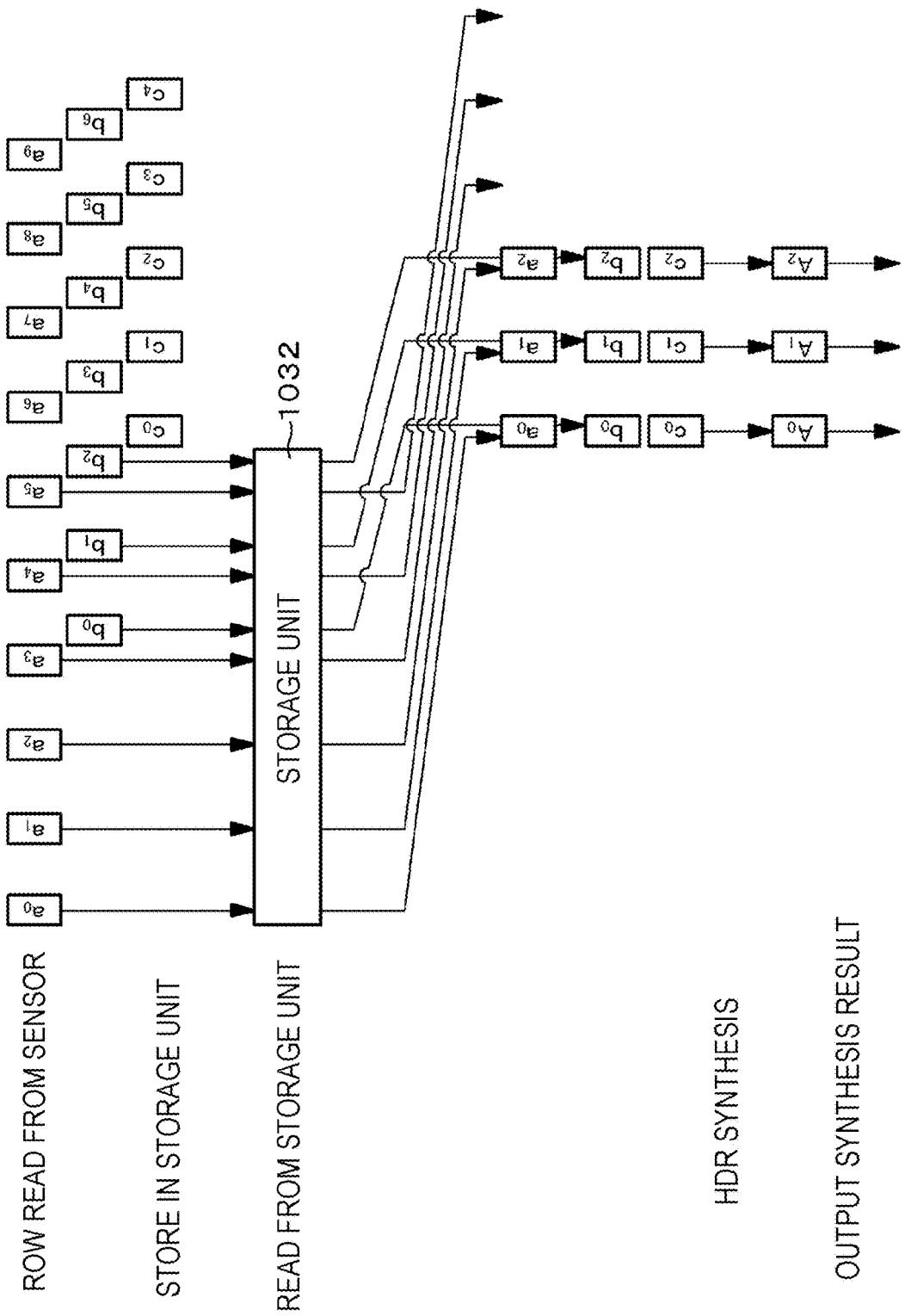
FIG. 18 is a diagram of a flow of image processing executed by the image processor according to the first embodiment.

Next, image processing executed by the image processor 103A according to the first embodiment having the above configuration will be described with reference to FIG. 18. FIG. 18 is a diagram of a flow of the image processing executed by the image processor 103A according to the first embodiment.

In the CMOS image sensor 10 in which unit pixels 20 are grouped into, for example, two kinds of pixel groups A and B, the pixel group A is exposed three times within the single vertical synchronization period, and the pixel group B is exposed once within the single vertical synchronization period (refer to exposure sequence 1 in FIG. 4). Then, pixel value data of three kinds of exposure images in the pixel group A is read from the CMOS image sensor 10 in a time division manner.

Specifically, first, the pixel value data of rows $a_0$, $a_1$, $a_2$, ... of the exposure image of exposure $A_{\_a}$ is sequentially read. Pixel value data of a first read row $b_0$ of an exposure image of exposure $A_{\_b}$ is read in a time division manner following to the read row $a_3$ of the exposure image of the exposure $A_{\_a}$. Pixel value data of an exposure image of an exposure $A_{\_c}$ is read in a time division manner similarly to the reading of the pixel value data of each of the exposure images of the exposure $A_{\_a}$ and the exposure $A_{\_b}$.

The pixel value data read from the CMOS image sensor 10 is supplied to the row sequence conversion unit 1031. The row sequence conversion unit 1031 temporarily stores the pixel value data of each row of the exposure image of the exposure $A_{\_a}$ and each row of the exposure image of the exposure $A_{\_b}$ read from the CMOS image sensor 10 in the storage unit 1032. Then, at a timing when the pixel value data of each row of the exposure image of the exposure $A_{\_c}$ is read, the row sequence conversion unit 1031 reads the pixel value data of the rows corresponding to the exposure image of the exposure $A_{\_a}$ and the exposure image of the exposure $A_{\_b}$ stored in the storage unit 1032. The HDR synthesis unit 1033 generates image data (HDR image data) with a high dynamic range (HDR) by forming the pixel value data of three kinds of exposure images.

In FIG. 18, a flow of processing after the pixel value data of each row of each exposure pixel of the exposure $A_{\_a}$, the exposure $A_{\_b}$, and the exposure $A_{\_c}$ is read from the CMOS image sensor 10 is illustrated. In this case, as illustrated in FIG. 18, in accordance with an order of reading from the CMOS image sensor 10, the pixel value data of the rows is stored in the storage unit 1032. The order of the pixel image data is, for example, $a_0$, $a_1$, $a_2$, $a_3$, $b_0$, $a_4$, $b_1$, $a_5$, $b_2$ .... After that, pixel value data $c_0$ of the first row of the exposure image of the exposure $A_{\_c}$ is read from the CMOS image sensor 10, and the pixel value data $a_0$ and $b_0$ of the corresponding row is read from the storage unit 1032 at the reading timing, and the synthesis result $A_0$ is output.

That is, a time lag between the read rows of the exposure images caused by a difference in the exposure timings of the exposure $A_{\_a}$, the exposure $A_{\_b}$, and the exposure $A_{\_c}$ is absorbed by synchronization processing by the storage in the storage unit 1032 and the reading from the storage unit 1032. With this processing, it is possible to synthesize the pixel value data in the same row of the corresponding exposure images and generate HDR data $A_0$, $A_1$, $A_2$, ....

Here, a necessary memory capacity of the storage unit 1032 is a data amount of rows as many as the rows which are read until the reading of the pixel value data $c_0$ of the row which is read first of the exposure $A_{\_c}$. This is because it is preferable that the data of the exposure images of the exposure $A_{\_a}$ and the exposure $A_{\_b}$ read at a timing after the pixel value data $c_0$ be overwritten to a memory region of the storage unit 1032 where the data of the exposure images of the exposure $A_{\_a}$ and the exposure $A_{\_b}$ has been already read.

Figure 19:
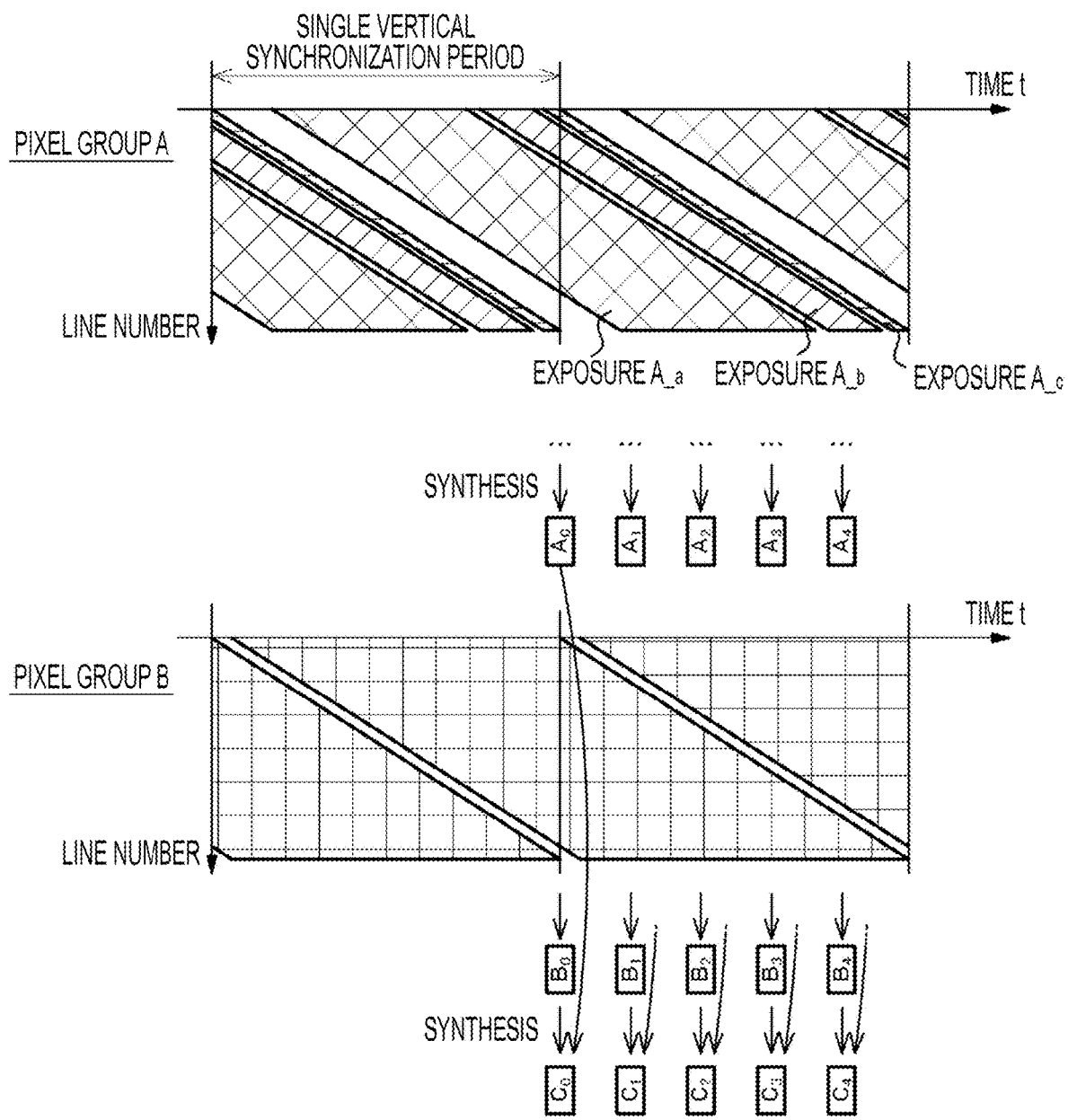
FIG. 19 is a diagram of a flow of image processing of synthesizing HDR image data from the pixel group A and output data from a pixel group B.

Furthermore, as illustrated in FIG. 19, it is possible to further synthesize HDR image data $A_0$, $A_1$, $A_2$, ... the pixel group A and output data $B_0$, $B_1$, $B_2$, ... from the pixel group B and output the synthesis result as HDR image data $C_0$, $C_1$, $C_2$, ....

As described above, in the first embodiment, in the row sequence conversion unit 1031, the synchronization processing is executed in which the pixel value data of each row of the exposure image of which the exposure order is not last within the single vertical synchronization period is held in the storage unit 1032 and the pixel value data of the same row is read from the storage unit 1032 according to the output timing of the pixel value data for each row of the final exposure image. With this processing, a memory capacity of the storage unit 1032 for waiting (for synchronization) which has been necessary to perform exposure a plurality of times within the single vertical synchronization period can be largely reduced. This is similarly applied to the following embodiments below.

(Second Embodiment)

The image processing according to the first embodiment is image processing in a case of the exposure sequence 1 in which the pixel groups A are exposed three times within the single vertical synchronization period, and the pixel groups B are exposed once within the single vertical synchronization period (refer to FIG. 4). On the other hand, as illustrated in FIG. 20, image processing according to the second embodiment is image processing in a case of an exposure sequence (referred to as "exposure sequence 2" below) for exposing both pixel groups A and B a plurality of times, for example, three times within the single vertical synchronization period.

Figure 20:
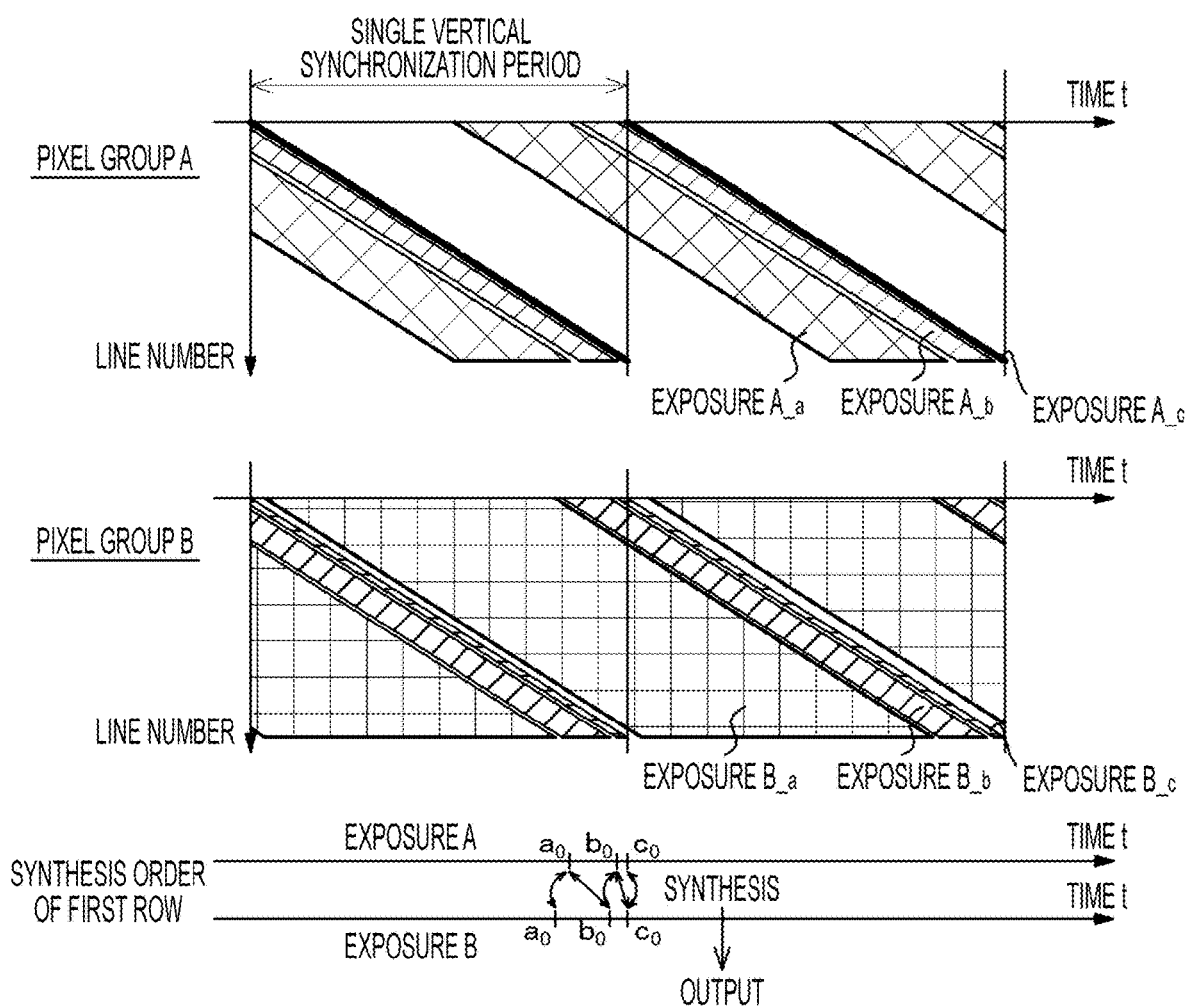
FIG. 20 is a diagram of another example of the exposure sequence (exposure sequence 2) according to the present embodiment.

FIG. 20 is a diagram of another example of the exposure sequence (exposure sequence 2) according to the present embodiment. In the exposure sequence 2, when it is assumed that the exposure images of the pixel groups A and the pixel groups B be $A_{\_a}$, $A_{\_b}$, $A_{\_c}$, $B_{\_a}$, $B_b$, and $B_{\_c}$, the exposure times are alternately set to be short and long in an order of $B_{\_a}$, $A_{\_a}$, $B_b$, $A_{\_b}$, $B_{\_c}$, and $A_{\_c}$.

Figure 21:
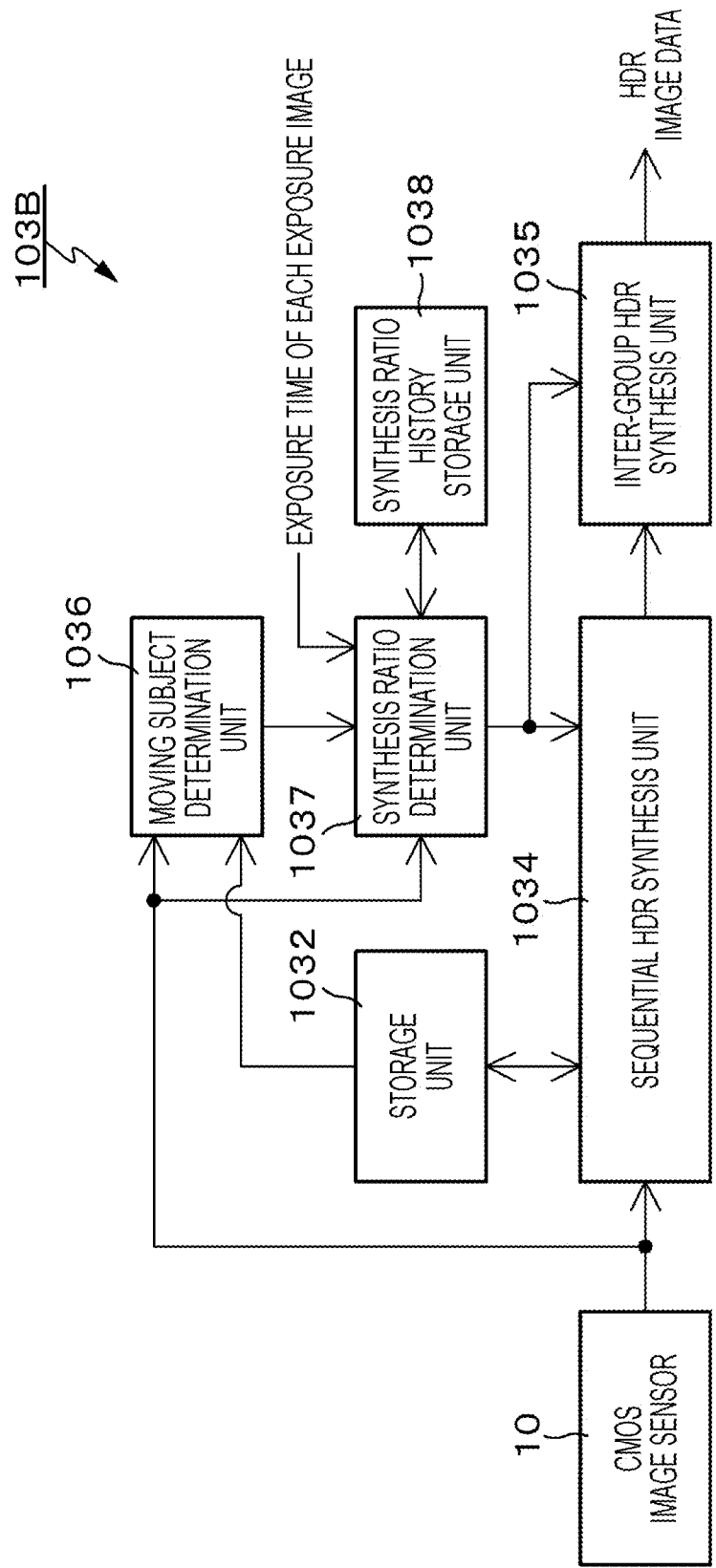
FIG. 21 is a block diagram of an exemplary configuration of an image processor according to a second embodiment.

FIG. 21 is a block diagram of an exemplary configuration of an image processor 103B according to the second embodiment. As illustrated in FIG. 21, the image processor 103B according to the second embodiment includes a sequential HDR synthesis unit 1034 as a second image synthesis unit instead of the row sequence conversion unit 1031 and the HDR synthesis unit 1033 in the first embodiment.

The sequential HDR synthesis unit 1034 holds pixel value data of an exposure image which is exposed first within the single vertical synchronization period in the same pixel group in a storage unit 1032. Furthermore, regarding the exposure image of which an exposure order is not first within the single vertical synchronization period, the sequential HDR synthesis unit 1034 calculates a synthesis value with reference to pixel value data corresponding to a pixel position and a peripheral pixel position of the exposure image which has been already held in the storage unit 1032 for each pixel and holds the value in the storage unit 1032. Then, when the synthesis of the pixel value data regarding the exposure image which is exposed last within the single vertical synchronization period has been completed, the sequential HDR synthesis unit 1034 outputs the synthesis result.

In a lower part of FIG. 20, a flow of processing of sequentially synthesizing six exposure images to which the exposure A and the exposure B are alternately applied, regarding the first rows in the image, by the sequential HDR synthesis unit 1034 and outputting the final result is illustrated. Regarding gaps between exposure timings of the six images, similarly to the first embodiment, synchronization processing is executed by using the storage unit 1032.

In addition to the storage unit 1032 and the sequential HDR synthesis unit 1034, the image processor 103B according to the second embodiment includes an inter-group HDR synthesis unit 1035, a moving subject determination unit 1036, a synthesis ratio determination unit 1037, and a synthesis ratio history storage unit 1038.

The inter-group HDR synthesis unit 1035 calculates a synthesis value between the pixel groups with reference to the final synthesis result of each pixel group obtained by synthesizing the exposure image which is exposed last within the single vertical synchronization period by the sequential HDR synthesis unit 1034 and outputs the synthesis value as HDR image data.

The moving subject determination unit 1036 determines (estimate) whether a subject moves at each pixel position, that is, whether the subject is a moving subject. More specifically, the moving subject determination unit 1036 determines whether the subject moves at each pixel position with reference to the pixel value of the exposure image and the pixel value in the storage unit 1032 and outputs the determination result.

On the basis of the determination result of the moving subject determination unit 1036, the synthesis ratio determination unit 1037 determines a synthesis ratio when the synthesis pixel value is calculated, that is, a synthesis ratio in the sequential HDR synthesis unit 1034 and the inter-group HDR synthesis unit 1035. The synthesis ratio history storage unit 1038 stores a previous history of the synthesis ratios of the sequential HDR synthesis unit 1034, that is, a history of the synthesis ratios determined by the synthesis ratio determination unit 1037 and outputs the history.

When determining the synthesis ratio on the basis of the estimation result of the moving subject determination unit 1036, the synthesis ratio determination unit 1037 determines a synthesis ratio with reference to the synthesis ratio history output from the synthesis ratio history storage unit 1038. In addition, the synthesis ratio determination unit 1037 determines a synthesis ratio with reference to an exposure time of each exposure image. Information on the exposure time of each exposure image can be obtained from the timing controller 16 (refer to FIG. 1). In addition, the synthesis ratio determination unit 1037 determines a synthesis ratio with reference to a pixel value level of each exposure image.

Figure 22:
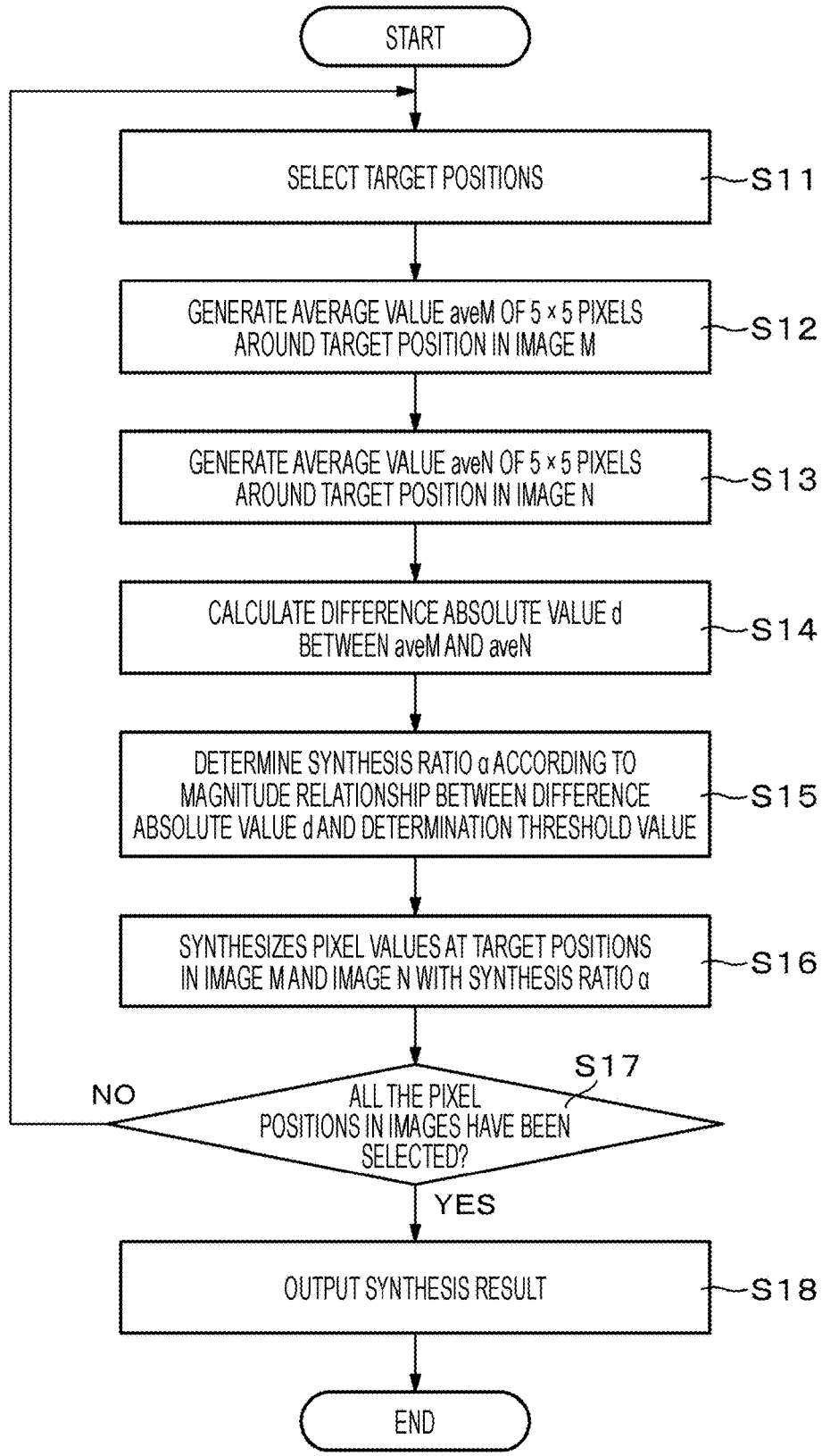
FIG. 22 is a flowchart of an exemplary flow of processing, of determining a synthesis ratio of two images according to estimation results of a moving subject for each pixel position and synthesizing the two images, executed by the image processor according to the second embodiment.

Here, an example of a flow of processing of estimating whether the subject moves at each pixel position by the moving subject determination unit 1036, determining the synthesis ratio between two images by the synthesis ratio determination unit 1037 according to the estimation result, and synthesizing the two images will be described with reference to a flowchart in FIG. 22. The series of processing is executed under control of the CPU included in the controller 105 (refer to FIG. 16). Furthermore, in FIG. 22, an image M and an image N respectively represent the two images to be sequentially synthesized.

The CPU selects target positions in the image M and the image N (step S11), generates an average value aveM of 5×5 pixels around the target position in the image M (step S12), and sequentially generates an average value aveN of 5×5 pixels around the target position in the image N (step S13). Next, the CPU calculates a difference absolute value d between the average value aveM and the average value aveN (step S14).

Next, the CPU determines a synthesis ratio α according to a magnitude relationship between the difference absolute value d and a determination threshold value (step S15). Specifically, in step S15, in a case where the difference absolute value d between the two images M and N is larger than the determination threshold value, it is determined that the pixel position is a moving body region, and processing of setting the synthesis ratio α is executed so that an image with a shorter exposure time is used.

Next, the CPU synthesizes pixel values at the target positions in the image M and the image N with the synthesis ratio α set in step S15 (step S16), and sequentially determines whether all the pixel positions in the two images M and N are selected, that is, whether the above processing at all the pixel positions on the two images M and N has been completed (step S17).

Then, if the processing has not been completed at all the pixel positions (No in S17), the CPU returns to step S11 and repeats the series of processing. Furthermore, if the processing has been completed (YES in S17), the CPU outputs the synthesis result (step S18). The series of processing, for one sequential HDR synthesis, of determining the synthesis ratio α between the two images M and N and synthesizing the two images M and N with the synthesis ratio α is completed.

As described above, in the second embodiment, the sequential HDR synthesis unit 1034 sequentially executes HDR synthesis processing from the exposure images having the same row numbers in the same pixel group for each pixel group. Then, the final HDR synthesis result obtained within the single vertical synchronization period is output from the sequential HDR synthesis unit 1034. In addition, the intergroup HDR synthesis unit 1035 executes processing of calculating the synthesis value between the pixel groups and outputting the result as HDR image data.

(Third Embodiment)

Figure 23:
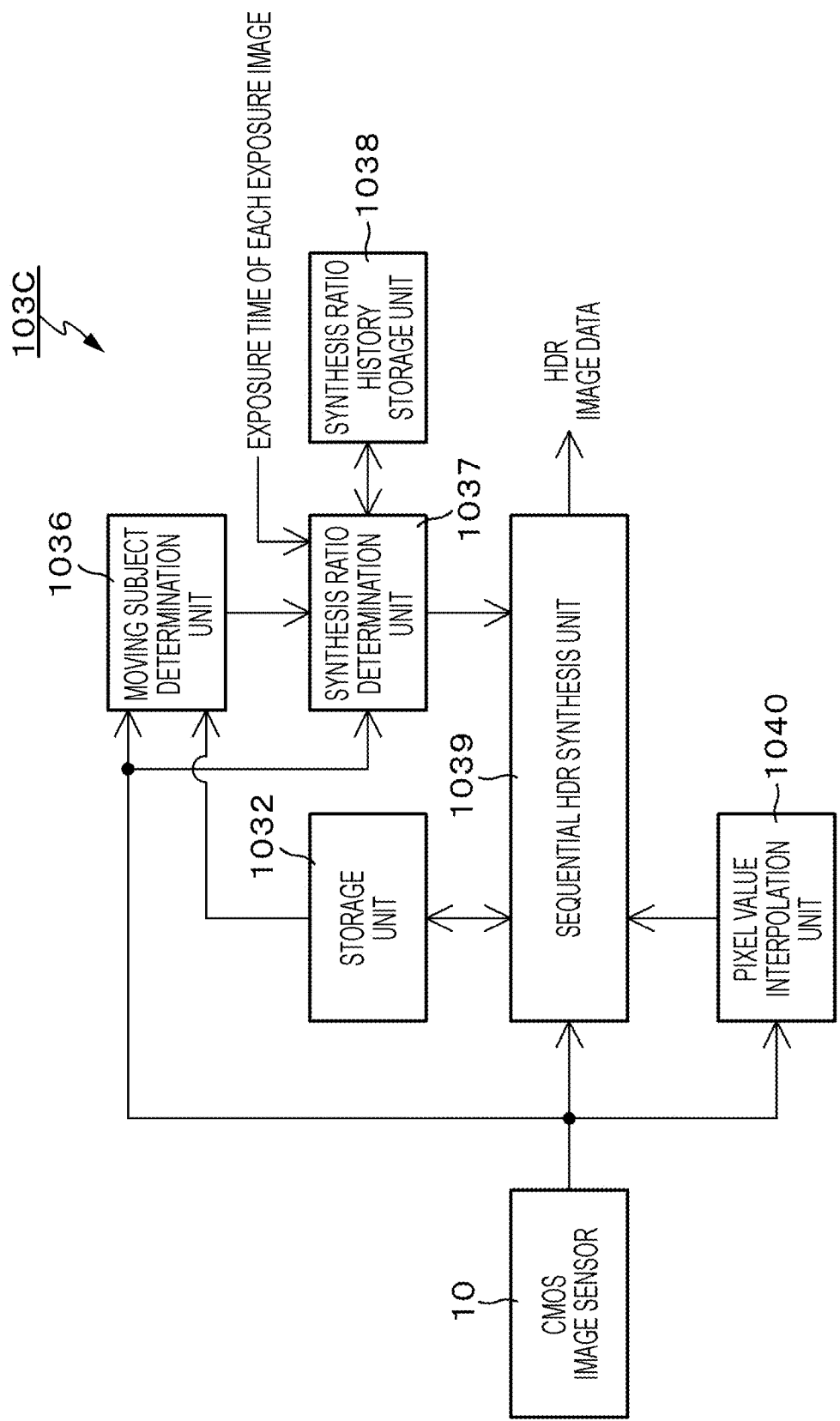
FIG. 23 is a block diagram of an exemplary configuration of an image processor according to a third embodiment.

FIG. 23 is a block diagram of an exemplary configuration of an image processor according to a third embodiment. As illustrated in FIG. 23, an image processor 103C according to the third embodiment includes a sequential HDR synthesis unit 1039 as a third image synthesis unit instead of the sequential HDR synthesis unit 1034 in the second embodiment. The image processor 103C according to the third embodiment further includes a pixel value interpolation unit 1040, and other components are the same as those of the image processor 103B according to the second embodiment.

The sequential HDR synthesis unit 1039 holds pixel value data of an exposure image which is exposed first within a single vertical synchronization period of exposure images in all the pixel groups in 1032. In addition, regarding the exposure image of which the exposure order is other than the first within the single vertical synchronization period, a synthesis pixel value is calculated with reference to pixel value data corresponding to a pixel position and a peripheral pixel position of the exposure image which has been already held in the storage unit 1032 for each pixel and is held in the storage unit 1032. Then, when the synthesis of the pixel value data regarding the exposure image which is exposed last within the single vertical synchronization period has been completed, the sequential HDR synthesis unit 1039 outputs the final synthesis result.

Here, a pixel group A and a pixel group B are sampled in different spatial phases. Therefore, in a previous stage of the sequential HDR synthesis unit 1039, the pixel value interpolation unit 1040 executes synthesis processing after interpolating pixel values to all the pixel positions. The pixel value interpolation unit 1040 interpolates pixel values to all the pixel positions on the basis of the pixel values read from a CMOS image sensor 10 for each pixel group.

At this time, when the sequential HDR synthesis unit 1039 receives an output from the pixel value interpolation unit 1040 and the received output indicates an image which is exposed first within the single vertical synchronization period of all the exposure images and in all the pixel groups, the sequential HDR synthesis unit 1039 holds the pixel value data in the storage unit 1032. Furthermore, when the image is the exposure image of which the exposure order is not first within the single vertical synchronization period, the sequential HDR synthesis unit 1039 performs operations of calculating the synthesis value with reference to the pixel value data corresponding to the pixel position and the peripheral pixel position of the exposure image which has been already held in the storage unit 1032 for each pixel and holding the value in the storage unit 1032.

As described above, in the third embodiment, the sequential HDR synthesis unit 1039 sequentially executes HDR synthesis processing between the pixel groups by using the storage unit 1032. Furthermore, the pixel value interpolation unit 1040 executes the processing of interpolating the pixel values read from the pixel group to all the pixel positions.

(Fourth Embodiment)

By the way, in a traffic light using a light emitting diode (LED) as a light source, a light sign using a fluorescent lamp as a light source, and the like, in a case where the light source is blinking due to a fluctuation of an AC power source, it can be seen as the lighting traffic light and sign are turned off or are flickering depending of a relationship between a period of blinking and a frame rate of a camera. This phenomenon is called as a flicker phenomenon. Under the flicker phenomenon, it can be seen that a light emitting object disappears (so-called blackout) or flickers. Such a phenomenon causes a problem particularly in in-vehicle cameras and the like used for recognition.

Figure 24:
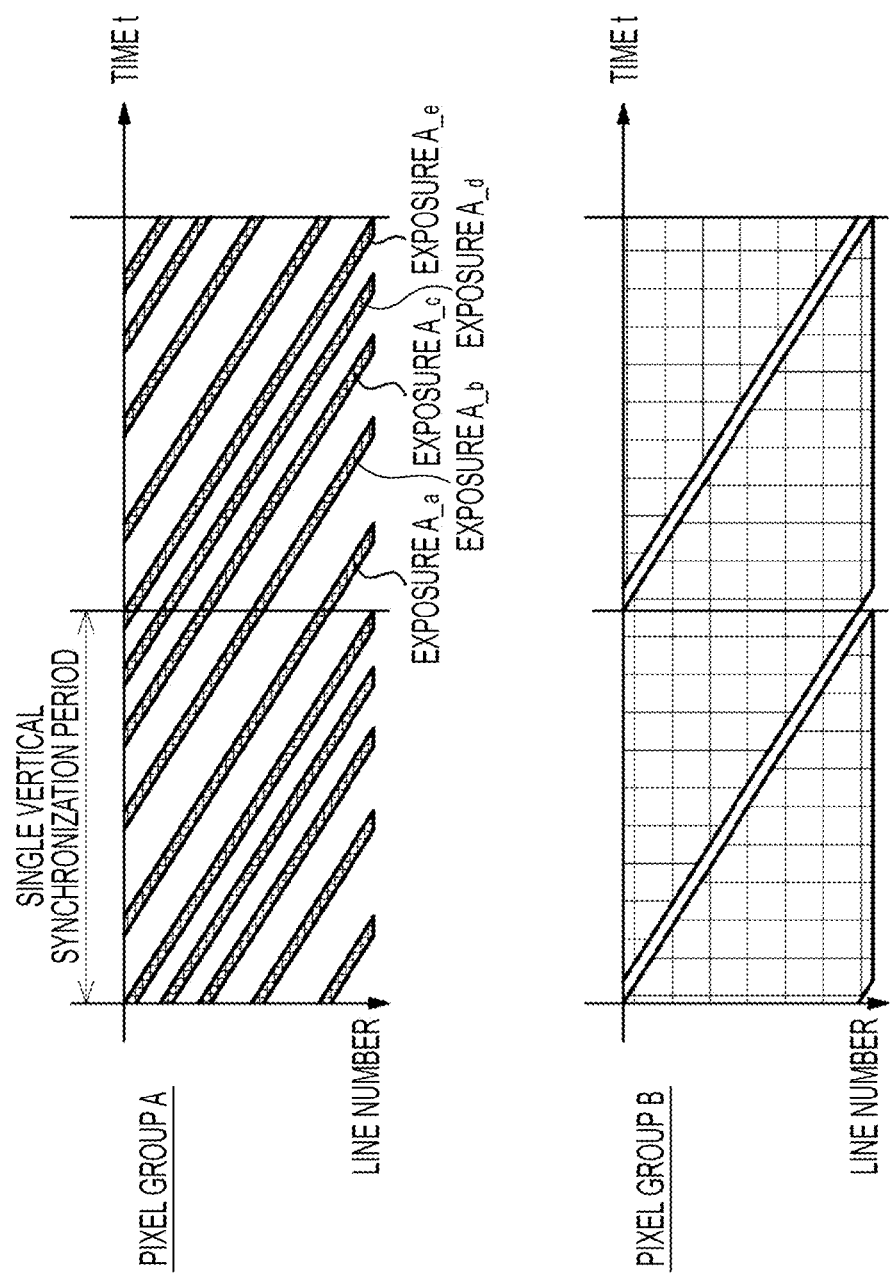
FIG. 24 is a diagram of an exposure sequence in a case of a fourth embodiment.

The fourth embodiment is provided to solve the disadvantage caused by the flicker phenomenon and is an exposure drive of preventing the phenomenon in which it can be seen that the light emitting object disappears or flickers. FIG. 24 illustrates an exposure sequence in a case of the fourth embodiment.

As illustrated in FIG. 24, in the exposure sequence according to the embodiment 34, for example, it is assumed that pixel groups A be exposed five times within a single vertical synchronization period and pixel groups B be exposed once within the single vertical synchronization period. The five-times exposures in the pixel groups A are referred to as exposure $A\_a$, exposure $A\_b$, exposure $A\_c$, exposure $A\_d$, and exposure $A\_e$ in an order from the earlier exposure start timing.

Regarding five exposure images by the five-times exposure $A\_a$, $A\_b$, $A\_c$, $A\_d$, and $A\_n$ in the pixel groups A, an exposure start time of a row which is read first of an image of which the exposure order is i-th within the single vertical synchronization period is referred to as $S_i$ [sec], an exposure period is referred to as $t_i$ [sec], and a blinking period of a flicker light source is referred to as T [sec]. Here, when it is assumed that an upper limit of an exposure time in which a subject scene including the light emitting object is imaged without saturation be $t_{max}$ [sec], all the exposure period $t_i$ satisfies $t_i < t_{max}$.

It is assumed that each exposure period $t_i$ is set so that a desired dynamic range can be realized by the five exposure images of the pixel group A and the one exposure image of the pixel group B. At this time, it is considered to set an exposure timing of each exposure image so as to image an image in a period when the light source is lighted.

When it is assumed that an exposure start time normalized by the flicker blinking period be a normalized exposure start time $xS_i$ [sec], $xS_i = S_i - \text{floor}(S_i/T) \cdot T$ is satisfied. Note that floor ( ) is a floor function. Here, it is considered the exposure period of each exposure image corresponds to which phase in the blinking period. When a range of the exposure period of the i-th image in the blinking period is represented by a set $M_i$, the following formulas are satisfied.

if($t_i > T$) $M_i = \{p | 0 < p \leq T\}$ else if($xS_i + t_i > T$) $M_i = \{p | 0 < p \leq xS_i + t_i - T \text{ or } xS_i \leq p \leq T\}$ else $M_i = \{p | xS_i < p \leq xS_i + t_i\}$.

Here, the reference p is an element representing a time included in the set $M_i$.

When the sum of the sets is assumed as $M_{all} = M_1 \cup M_2 \cup \ldots \cup M_N$, if each exposure timing is set on the basis of the exposure start time $S_i$ that maximizes a value range of $M_{all}$, it is possible to realize exposure with which the flicker lighting period can easily captured.

As described above, in the fourth embodiment, in a case where the light emitting object which blinks at high frequencies such as the traffic light using the LED as a light source is captured, the exposure start time and an exposure time length of each of the plurality of exposure images are set in consideration of the blinking period of the light emitting object. With this processing, since the exposure sequence can be determined without missing a light emission timing of the light emitting object, a light source object which is blinked or turned off in an image imaged with an existing method can be imaged while easily capturing the light emission timing.

<Electronic Apparatus according to the Present Disclosure>

The CMOS image sensor 10 according to the above embodiments can be used for imaging devices such as a digital still camera, a video camera, a monitoring camera, and an in-vehicle camera. In addition, the CMOS image sensor 10 can be used for electronic apparatus in general having an imaging function such as a mobile phone and a smartphone as an imaging unit.

Figure 25:
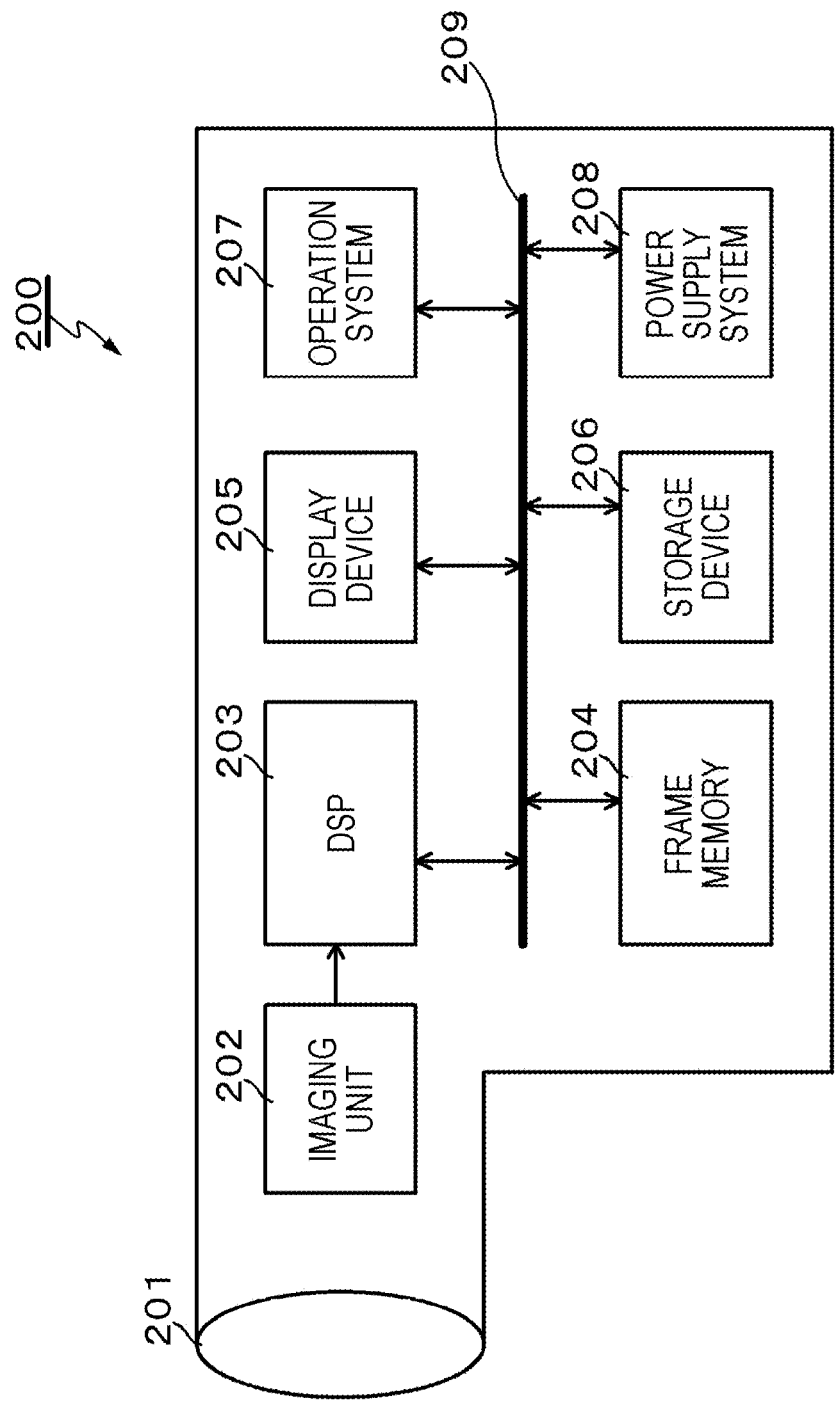
FIG. 25 is a system configuration diagram of a schematic configuration of an electronic apparatus according to the present disclosure.

FIG. 25 is a system configuration diagram of a schematic configuration of an electronic apparatus according to the present disclosure. As illustrated in FIG. 25, an electronic apparatus 200 according to the present disclosure includes an optical system 201 including a lens group and the like, an imaging unit 202, a DSP circuit 203 which is a camera signal processing unit, a frame memory 204, a display device 205, a recording device 206, an operation system 207, a power supply system 208, and the like. Then, the DSP circuit 203, the frame memory 204, the display device 205, the recording device 206, the operation system 207, and the power supply system 208 are mutually connected via a bus line 209.

The optical system 201 forms an image on an imaging surface of the imaging unit 202 by taking incident light (image light) from the subject. The imaging unit 202 converts an amount of the incident light focused on the imaging surface by the optical system 201 in pixel units into an electric signal and outputs the signal as a pixel signal. The CMOS image sensor 10 according to the above embodiments can be used as the imaging unit 202.

Here, in a case where the CMOS image sensor 10 incorporates the image processor 103 (refer to FIG. 16) described above, the DSP circuit 203 executes general camera signal processing such as white balance processing, demosaic processing, and gamma correction processing. In a case where the CMOS image sensor 10 does not incorporate the image processor 103, the DSP circuit 203 executes processing of the image processor 103 before the general camera signal processing.

The frame memory 204 is appropriately used for storing data in the process of the signal processing by the DSP circuit 203. The display device 205 includes a panel-type display device such as a liquid crystal display device or an organic electro luminescence (EL) display device and displays a moving image or a still image imaged up by the imaging unit 202. The recording device 206 records the moving image or the still image imaged by the imaging unit 202 in a recording medium such as a portable semiconductor memory, an optical disk, and a hard disk drive (HDD).

The operation system 207 issues an operation command for various functions of the electronic apparatus 200 by a user's operation. The power supply system 208 appropriately supplies various power supplies to be an operation power supplies of the DSP circuit 203, the frame memory 204, the display device 205, the recording device 206, and the operation system 207 to these devices.

In the electronic apparatus 200 according to the present disclosure described above, by using the CMOS image sensor 10 or the imaging device 100 as the imaging unit 202, a scene with a high dynamic range can be imaged without deteriorating a spatial resolution.

Note that the present disclosure can employ the following configuration.

[1] A solid-state imaging device including:
a pixel array unit in which unit pixels including photoelectric conversion elements are arranged in a matrix form and the unit pixels are grouped into a plurality of pixel groups; and
a timing controller which independently sets an exposure start timing and an exposure end timing relative to each of the plurality of pixel groups so that at least one pixel group of the plurality of pixel groups is exposed a plurality of times within a single vertical synchronization period.

[2] The solid-state imaging device according to [1], in which
the timing controller independently sets the exposure start timing and the exposure end timing relative to each of the plurality of pixel groups so that an exposure end timing of a unit pixel in a row which is read first of an exposure image to which exposure has been started later is earlier than an exposure end timing of a unit pixel of a row which is a final read row of an exposure image to which the exposure has been previously started regarding at least two times of exposures of the plurality of times of exposures.

[3] The solid-state imaging device according to [2], in which
the timing controller performs control to output image data for each row in a time division manner regarding a plurality of exposure images of which the exposure ends are temporally overlapped.

[4] The solid-state imaging device according to any one of [1] to [3], further including:
an image processor which generates an image with a high dynamic range on the basis of the image data of each exposure image of the plurality of pixel groups.

[5] The solid-state imaging device according to [4], in which
the image processor includes a row sequence conversion unit which holds pixel value data for each row of an exposure image which is not exposed last within the single vertical synchronization period in a storage unit, reads the pixel value data of the same row from the storage unit according to an output timing of pixel value data for each row of an exposure image which is exposed last within the single vertical synchronization period, and outputs the plurality of exposure images as aligning the rows.

[6] The solid-state imaging device according to [5], in which
the image processor includes a first image synthesis unit which synthesizes the pixel value data of the plurality of exposure pixels output from the row sequence conversion unit as aligning the rows between the plurality of exposure pixels and outputs the synthesized data.

[7] The solid-state imaging device according to [4], in which
the image processor includes a second image synthesis unit which holds pixel value data of an exposure image which is exposed first within the single vertical synchronization period in the storage unit, calculates a synthesis pixel value of an exposure image of which an exposure order is other than first within the single vertical synchronization period with reference to pixel value data corresponding to a pixel position and a peripheral pixel position of the image which has been already held in the storage unit for each pixel and holds the calculated value in the storage unit, and outputs a final synthesis result when synthesis of pixel value data of an exposure image which is exposed last within the single vertical synchronization period has been completed.

[8] The solid-state imaging device according to [7], in which
the second image synthesis unit holds pixel value data of an exposure image which is exposed first within the single vertical synchronization period in the storage unit, and calculates a synthesis pixel value of an exposure image of which an exposure order is other than first within the single vertical synchronization period with reference to the pixel value data corresponding to the pixel position and the peripheral pixel position of the image which has been already held in the storage unit for each pixel and holds the calculated value in the storage unit, in each pixel group.

[9] The solid-state imaging device according to [7] or [8], in which
the image processor includes an inter-group synthesis unit which calculates a synthesis value between the pixel groups with reference to the final synthesis result of each pixel group obtained by synthesizing the exposure image which is exposed last within the single vertical synchronization period by the second image synthesis unit.

[10] The solid-state imaging device according to [7], in which
the image processor includes a third image synthesis unit which holds the pixel value data of the exposure image which is exposed first within the single vertical synchronization period, of exposure images in all the pixel groups, in the storage unit, calculates a synthesis pixel value of the exposure image of which an exposure order is other than first within the single vertical synchronization period with reference to the pixel value data of the pixel position and the peripheral pixel position of the image which has been already held in the storage unit for each pixel and holds the calculated value in the storage unit, and outputs the final synthesis result when the synthesis of the pixel value data of the exposure image which is exposed last within the single vertical synchronization period has been completed.

[11] The solid-state imaging device according to [10], in which
the image processor includes a pixel value interpolation unit which interpolates pixel values to all the pixel positions on the basis of pixel values read for the respective pixel groups, and
the third image synthesis unit holds, in the storage unit, the pixel value data of the exposure image which is exposed first within the single vertical synchronization period of all the exposure images in all the pixel groups on the basis of an output of the pixel value interpolation unit, calculates a synthesis pixel value of an exposure image of which an exposure order is other than first within the single vertical synchronization period with reference to the pixel value data corresponding to the pixel position and the peripheral pixel position of the image which have been already held in the storage unit for each pixel, and holds the calculated synthesis pixel value in the storage unit.

[12] The solid-state imaging device according to any one of [7] to [10], in which
the image processor includes:
a moving subject determination unit which determines whether a subject moves at each pixel position; and
a synthesis ratio determination unit which determines a synthesis ratio at the time of calculating the synthesis pixel value on the basis of the determination result of the moving subject determination unit.

[13] The solid-state imaging device according to [12], in which
the moving subject determination unit estimates whether the subject moves at each pixel position with reference to a pixel value of the exposure image and a pixel value in the storage unit.

[14] The solid-state imaging device according to [12] or [13], in which
the image processor includes a synthesis ratio history storage unit which stores a history of the synthesis ratios determined by the synthesis ratio determination unit, and
the synthesis ratio determination unit determines a synthesis ratio with reference to the history of the synthesis ratios stored in the synthesis ratio history storage unit.

[15] The solid-state imaging device according to any one of [12] to [14], in which
the synthesis ratio determination unit determines the synthesis ratio with reference to an exposure time of each exposure image.

[16] The solid-state imaging device according to any one of [12] to [15], in which
the synthesis ratio determination unit determines the synthesis ratio with reference to a pixel value level of each exposure image.

[17] The solid-state imaging device according to any one of [1] to [16], including:
an A/D converter which digitizes an analog pixel signal output for each pixel column from each unit pixel of the pixel array unit.

[18] An imaging device including:
a solid-state imaging device including:
a pixel array unit in which unit pixels including photoelectric conversion elements are arranged in a matrix form and the unit pixels are grouped into a plurality of pixel groups; and
a timing controller which independently sets an exposure start timing and an exposure end timing relative to each of the plurality of pixel groups so that at least one pixel group of the plurality of pixel groups is exposed a plurality of times within a single vertical synchronization period.

[19] The imaging device according to [18], in which
in a case of capturing a light emitting object, the timing controller sets an exposure start time and an exposure time length of each of a plurality of exposure images imaged by the plurality of times of exposures in consideration of a blinking period of the light emitting object.

[20] An electronic apparatus including:
a solid-state imaging device including:
a pixel array unit in which unit pixels including photoelectric conversion elements are arranged in a matrix form and each unit pixel is grouped into a plurality of pixel groups; and
a timing controller which independently sets an exposure start timing and an exposure end timing relative to each of the plurality of pixel groups so that at least one pixel group of the plurality of pixel groups is exposed a plurality of times within a single vertical synchronization period.

REFERENCE SIGNS LIST

10 CMOS image sensor
11 Pixel array unit
12 Row scanning unit
13 Column processing unit
14 Column scanning unit 15 Horizontal output line
16 Timing controller
20 Unit pixel
21 Photodiode (PD)
22 Transfer transistor
23 Reset transistor
24 Amplifier transistor
25 Selection transistor
26 FD unit (electric charge detection unit)
30 Semiconductor substrate
31($31_1$ to $31_m$) Row control line
32($32_1$ to $32_n$) Column signal line
40($40_1$ to $40_n$) A/D converter
100 Imaging device
101 Optical lens
102 Imaging unit
103, 103A, 103B, 103C Image processor
104 Camera signal processing unit
105 Controller
1031 Row sequence conversion unit
1032 Storage unit
1033 HDR synthesis unit (first image synthesis unit)
1034 Sequential HDR synthesis unit (second image synthesis unit)
1035 Inter-group HDR synthesis unit
1036 Moving subject determination unit
1037 Synthesis ratio determination unit
1038 Synthesis ratio history storage unit
1039 Sequential HDR synthesis unit (third image synthesis unit)
1040 Pixel value interpolation unit
200 Electronic apparatus.

The invention claimed is:

1. A solid-state imaging device comprising:
a pixel array unit in which unit pixels including photoelectric conversion elements are arranged in a matrix form and the unit pixels are grouped into a plurality of pixel groups; and
a timing controller configured to independently set an exposure start timing and an exposure end timing relative to each of the plurality of pixel groups so that at least one pixel group of the plurality of pixel groups is exposed a plurality of times within a single vertical synchronization period, wherein
in a case of capturing a light emitting object, the timing controller sets an exposure start time and an exposure time length of each of a plurality of exposure images imaged by the plurality of times of exposures in consideration of a blinking period of the light emitting object.

2. The solid-state imaging device according to claim 1, wherein
the timing controller independently sets the exposure start timing and the exposure end timing relative to each of the plurality of pixel groups so that an exposure end timing of a unit pixel in a row which is read first of an exposure image to which exposure has been started later is earlier than an exposure end timing of a unit pixel of a row which is a final read row of an exposure image to which the exposure has been previously started regarding at least two times of exposures of the plurality of times of exposures.

3. The solid-state imaging device according to claim 2, wherein
the timing controller performs control to output image data for each row in a time division manner regarding a plurality of exposure images of which the exposure ends are temporally overlapped.

4. The solid-state imaging device according to claim 1, further comprising:
an image processor configured to generate an image with a high dynamic range on the basis of the image data of each exposure image of the plurality of pixel groups.

5. The solid-state imaging device according to claim 4, wherein
the image processor includes a row sequence conversion unit which holds pixel value data for each row of an exposure image which is not exposed last within the single vertical synchronization period in a storage unit, reads the pixel value data of the same row from the storage unit according to an output timing of pixel value data for each row of an exposure image which is exposed last within the single vertical synchronization period, and outputs the plurality of exposure images as aligning the rows.

6. The solid-state imaging device according to claim 5, wherein
the image processor includes a first image synthesis unit which synthesizes the pixel value data of the plurality of exposure pixels output from the row sequence conversion unit as aligning the rows between the plurality of exposure pixels and outputs the synthesized data.

7. The solid-state imaging device according to claim 4, wherein
the image processor includes a second image synthesis unit which holds pixel value data of an exposure image which is exposed first within the single vertical synchronization period in the storage unit, calculates a synthesis pixel value of an exposure image of which an exposure order is other than first within the single vertical synchronization period with reference to pixel value data corresponding to a pixel position and a peripheral pixel position of the image which has been already held in the storage unit for each pixel and holds the calculated value in the storage unit, and outputs a final synthesis result when synthesis of pixel value data of an exposure image which is exposed last within the single vertical synchronization period has been completed.

8. The solid-state imaging device according to claim 7, wherein
the second image synthesis unit holds pixel value data of an exposure image which is exposed first within the single vertical synchronization period in the storage unit, and calculates a synthesis pixel value of an exposure image of which an exposure order is other than first within the single vertical synchronization period with reference to the pixel value data corresponding to the pixel position and the peripheral pixel position of the image which has been already held in the storage unit for each pixel and holds the calculated value in the storage unit, in each pixel group.

9. The solid-state imaging device according to claim 7, wherein
the image processor includes an inter-group synthesis unit which calculates a synthesis value between the pixel groups with reference to the final synthesis result of each pixel group obtained by synthesizing the exposure image which is exposed last within the single vertical synchronization period by the second image synthesis unit.

10. The solid-state imaging device according to claim 7, wherein
the image processor includes a third image synthesis unit which holds the pixel value data of the exposure image which is exposed first within the single vertical synchronization period, of exposure images in all the pixel groups, in the storage unit, calculates a synthesis pixel value of the exposure image of which an exposure order is other than first within the single vertical synchronization period with reference to the pixel value data of the pixel position and the peripheral pixel position of the image which has been already held in the storage unit for each pixel and holds the calculated value in the storage unit, and outputs the final synthesis result when the synthesis of the pixel value data of the exposure image which is exposed last within the single vertical synchronization period has been completed.

11. The solid-state imaging device according to claim 10, wherein
the image processor includes a pixel value interpolation unit which interpolates pixel values to all the pixel positions on the basis of pixel values read for the respective pixel groups, and
the third image synthesis unit holds, in the storage unit, the pixel value data of the exposure image which is exposed first within the single vertical synchronization period of all the exposure images in all the pixel groups on the basis of an output of the pixel value interpolation unit, calculates a synthesis pixel value of an exposure image of which an exposure order is other than first within the single vertical synchronization period with reference to the pixel value data corresponding to the pixel position and the peripheral pixel position of the image which have been already held in the storage unit for each pixel, and holds the calculated synthesis pixel value in the storage unit.

12. The solid-state imaging device according to claim 7, wherein
the image processor includes:
a moving subject determination unit which determines whether a subject moves at each pixel position; and
a synthesis ratio determination unit which determines a synthesis ratio at the time of calculating the synthesis pixel value on the basis of the determination result of the moving subject determination unit.

13. The solid-state imaging device according to claim 12, wherein
the moving subject determination unit estimates whether the subject moves at each pixel position with reference to a pixel value of the exposure image and a pixel value in the storage unit.

14. The solid-state imaging device according to claim 12, wherein
the image processor includes a synthesis ratio history storage unit which stores a history of the synthesis ratios determined by the synthesis ratio determination unit, and
the synthesis ratio determination unit determines a synthesis ratio with reference to the history of the synthesis ratios stored in the synthesis ratio history storage unit.

15. The solid-state imaging device according to claim 12, wherein
the synthesis ratio determination unit determines the synthesis ratio with reference to an exposure time of each exposure image.

16. The solid-state imaging device according to claim 12, wherein
the synthesis ratio determination unit determines the synthesis ratio with reference to a pixel value level of each exposure image.

17. The solid-state imaging device according to claim 1, further comprising:
an A/D converter configured to digitize an analog pixel signal output for each pixel column from each unit pixel of the pixel array unit.

18. An imaging device comprising:
a solid-state imaging device including:
a pixel array unit in which unit pixels including photoelectric conversion elements are arranged in a matrix form and the unit pixels are grouped into a plurality of pixel groups; and
a timing controller which independently sets an exposure start timing and an exposure end timing relative to each of the plurality of pixel groups so that at least one pixel group of the plurality of pixel groups is exposed a plurality of times within a single vertical synchronization period, wherein
in a case of capturing a light emitting object, the timing controller sets an exposure start time and an exposure time length of each of a plurality of exposure images imaged by the plurality of times of exposures in consideration of a blinking period of the light emitting object.

19. An electronic apparatus comprising:
a solid-state imaging device including:
a pixel array unit in which unit pixels including photoelectric conversion elements are arranged in a matrix form and the unit pixels are grouped into a plurality of pixel groups; and
a timing controller which independently sets an exposure start timing and an exposure end timing relative to each of the plurality of pixel groups so that at least one pixel group of the plurality of pixel groups is exposed a plurality of times within a single vertical synchronization period, wherein
in a case of capturing a light emitting object, the timing controller sets an exposure start time and an exposure time length of each of a plurality of exposure images imaged by the plurality of times of exposures in consideration of a blinking period of the light emitting object.

* * * * *